US009976913B2

(12) United States Patent
Caraveo Frescas et al.

(10) Patent No.: US 9,976,913 B2
(45) Date of Patent: May 22, 2018

(54) THERMAL HISTORY DEVICES, SYSTEMS FOR THERMAL HISTORY DETECTION, AND METHODS FOR THERMAL HISTORY DETECTION

(71) Applicant: King Abdullah University of Science and Technology, Thuwal (SA)

(72) Inventors: Jesus Alfonso Caraveo Frescas, Thuwal (SA); Husam Alshareef, Thuwal (SA)

(73) Assignee: KING ABDULLAH UNIVERSITY OF SCIENCE AND TECHNOLOGY, Thuwal (SA)

( * ) Notice: Subject to any disclaimer, the term of this patent is extended or adjusted under 35 U.S.C. 154(b) by 749 days.

(21) Appl. No.: 14/548,605

(22) Filed: Nov. 20, 2014

(65) Prior Publication Data

US 2015/0146761 A1    May 28, 2015

Related U.S. Application Data

(60) Provisional application No. 61/908,906, filed on Nov. 26, 2013.

(51) Int. Cl.
| | |
|---|---|
| *G01K 7/00* | (2006.01) |
| *G01K 3/00* | (2006.01) |
| *G01K 7/01* | (2006.01) |
| *H01L 29/24* | (2006.01) |
| *G01K 3/04* | (2006.01) |
| *B82Y 10/00* | (2011.01) |
| *B82Y 40/00* | (2011.01) |
| *H01L 29/06* | (2006.01) |
| *H01L 29/66* | (2006.01) |

(Continued)

(52) U.S. Cl.
CPC ............... *G01K 7/01* (2013.01); *B82Y 10/00* (2013.01); *B82Y 40/00* (2013.01); *G01K 3/04* (2013.01); *H01L 29/0673* (2013.01); *H01L 29/24* (2013.01); *H01L 29/66969* (2013.01); *H01L 29/7869* (2013.01); *H01L 29/78693* (2013.01); *H01L 29/78696* (2013.01); *H01L 29/775* (2013.01)

(58) Field of Classification Search
USPC .......................................... 374/178, 166, 137
See application file for complete search history.

(56) References Cited

U.S. PATENT DOCUMENTS

| 8,614,492 B2 * | 12/2013 | Bryant | ................... B82Y 10/00 257/415 |
|---|---|---|---|
| 2005/0181587 A1 * | 8/2005 | Duan | ..................... B82Y 10/00 438/551 |

(Continued)

OTHER PUBLICATIONS

Arias, A. C., et al. "Materials and Applications for Large Area Electronics: Solution-Based Approaches", Chemical Review, Jan. 13, 2010, vol. 110, pp. 3-24.

(Continued)

*Primary Examiner* — Mirellys Jagan
(74) *Attorney, Agent, or Firm* — Patent Portfolio Builders PLLC

(57) ABSTRACT

Embodiments of the present disclosure include nanowire field-effect transistors, systems for temperature history detection, methods for thermal history detection, a matrix of field effect transistors, and the like.

20 Claims, 16 Drawing Sheets

(51) Int. Cl.
*H01L 29/786* (2006.01)
*H01L 29/775* (2006.01)

(56) References Cited

U.S. PATENT DOCUMENTS

| | | | | |
|---|---|---|---|---|
| 2007/0126037 A1* | 6/2007 | Ikeda | B82Y 10/00 | |
| | | | 257/288 | |
| 2007/0228439 A1* | 10/2007 | Duan | B82Y 10/00 | |
| | | | 257/296 | |
| 2008/0224122 A1* | 9/2008 | Saitoh | B82Y 10/00 | |
| | | | 257/14 | |
| 2013/0240983 A1* | 9/2013 | Larrieu | B82Y 10/00 | |
| | | | 257/329 | |
| 2013/0337567 A1* | 12/2013 | Shin | G01N 27/4146 | |
| | | | 436/63 | |
| 2015/0053913 A1* | 2/2015 | Cheng | H01L 29/78696 | |
| | | | 257/9 | |
| 2015/0069330 A1* | 3/2015 | Baek | H01L 29/775 | |
| | | | 257/29 | |

OTHER PUBLICATIONS

Batzill, M., et al. "The Surface and Materials Science of Tin Oxide", Profress in Surface Science, 2005, vol. 79, pp. 47-154.
Fortunato, E. M. C., et al., "Fully Transparent ZnO Thin-Film Transistor Produced at Room Temperature", Advanced Materials, Mar. 8, 2005, vol. 17, No. 5, pp. 590-594.
Fortunato, E., et al., "Thin-Film Transistors Based on p-type Cu2O Thin Films Produced at Room Temperature", Applied Physics Letters, Sep. 7, 2010, vol. 96, pp. 192102-1-192102-3.
Fortunato, E., et al., "Transparent p-type SnOx Thin Film Transistors Produced by Reactive rf Magnetron Sputtering Followed by Low Temperature Annealing", Applied Physics Letters, Aug. 2010, vol. 97, pp. 052105-1-052105-3.
Guo, W., et al., "Microstructure, Optical, and Electrical Properties of p-type SnO Thin Films", Applied Physics Letters, Jan. 2010, vol. 96, pp. 042113-1-042113-3.
Kim, H. S., et al., "High Performance Solution—Processed Indium Oxide Thin-Film Transistors", Journal American Chemical Society, Aug. 29, 2008, vol. 130, pp. 12580-12581.
Kim, K. M., et al., "Competitive Device Performance of Low-Temperature and All-Solution-Processed Metal-Oxide Thin-Film Transistors", Applied Physics Letters, Dec. 2011, vol. 99, pp. 242109-1-242109-3.
Kim, M.-G.; et al., "Low-Temperature Fabrication of High-Performance Metal Oxide Thin-Film Electronics via Combustion Processing", Nature Materials, Apr. 17, 2011, vol. 10, pp. 382-388.
Lee, C-G., et al., "Solution-Processed Zinc-Tin Oxide Thin-Film Transistors With Low Interfacial Trap Density and Improved Perforamnce", Applied Physics Letters, May 2010, vol. 96, pp. 243501-1-243501-3.
Liang, L. Y., et al., "The Structural, Optical and Electrical Properties of Y-doped SnO Thin Films and Their p-Type TFT Application", Journal of Physics D: Applied Physics, Feb. 9, 2012, vol. 45, pp. 085101-1-085101-5.
Nayak, P. K., et al., "High Performance Solution-Deposited Amorphous Indium Gallium Zinc Oxide Thin Film Transistors by Oxygen Plasma Treatment", Applied Physics Letters, May 2012, vol. 100, pp. 202106-1-202106-4.
Nomura, K., et al., "Room-Temperature Fabrication of Transparent Flexible Thin-Film Transistors Using Amorphous Dxide Semiconductors", Nature, Oct. 5, 2004, vol. 432, pp. 484-492.
Pan, X. Q., et al., "Oxidation and Phase Transitions of Epitaxial Tin Oxide Thin Films on (1012) Sapphire", Journal of Applied Physics, Jun. 1, 2001, vol. 89, No. 11, pp. 6048-6055.
Reuss, R.H., et al., "Macroelectronics: Perspectives on Technology and Applications", Proceedings of the IEEE, Jul. 5, 2005, vol. 93, No. 7, pp. 1239-1256.
Sun, Y., et al., "Inorganic Semiconductors for Flexible Electronics", Advanced Materials, Jul. 12, 2007, vol. 19, pp. 1897-1916.
Togo, A., et al., "First-Principles Calculations of Native Defects in Tin Monoxide", Physics Review B, Nov. 29, 2006, vol. 74, pp. 195128-1-195128-8.
Watson, G. W., "The Origin of the Electron Distribution in SnO", Journal of Chemical Physics, Dec. 2001, vol. 114, No. 2, pp. 758-763.
Yabuta, H., et al. "Sputtering Formation of p-Type SnO Thin-Film Transistors on Glass Toward Oxide Complimentary Circuits", Applied Physics Letters, Aug. 2010, vol. 97, pp. 072111-1-072111-3.
Yao, Z. Q., et al. "Room Temperature Fabrication of p-Channel Cu2O Thin-Film Transistors on Flexible Polyethylene Terephthalate Substrates", Applied Physics Letters, Jul. 27, 2012, vol. 101, pp. 042114-1-042114-4.

* cited by examiner

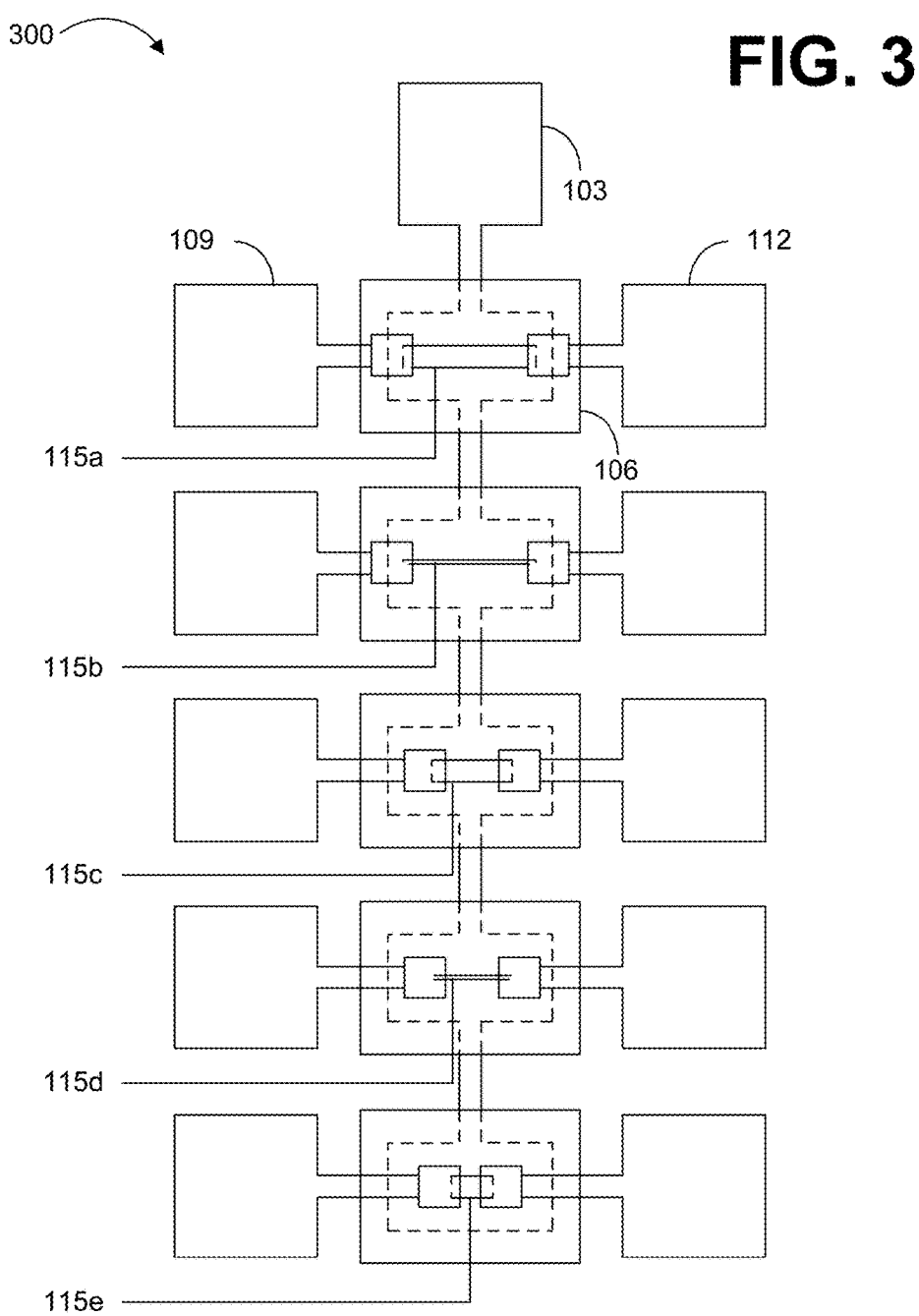

THERMAL HISTORY DEVICES, SYSTEMS FOR THERMAL HISTORY DETECTION, AND METHODS FOR THERMAL HISTORY DETECTION

CLAIM OF PRIORITY TO RELATED APPLICATION

This application claims priority to U.S. provisional application entitled "THERMAL HISTORY DEVICES, SYSTEMS FOR THERMAL HISTORY DETECTION, AND METHODS FOR THERMAL HISTORY DETECTION" having Ser. No. 61/908,906, filed on Nov. 26, 2013, which is entirely incorporated herein by reference.

BACKGROUND

Many items are constantly exposed to varying temperature extremities during production, storage, and transportation. Typically, a thermal history sensor device monitor whether a portion of an item has been exposed to a certain maximum temperature. However, such monitoring often requires the use of power. In situations where power is not readily available, systems and methods of thermal history detection without consuming power may be necessary.

SUMMARY

Embodiments of the present disclosure include nanowire field-effect transistors, systems for temperature history detection, methods for thermal history detection, a matrix of field effect transistors, and the like.

An embodiment of the system for temperature history detection, among others, includes: at least one field effect transistor comprising a substrate comprising; a gate electrode made of a material with conductive properties; a plurality of gate dielectrics positioned in proximity to the gate electrode, wherein the gate dielectrics are insulators; and a plurality of nanowires, wherein an individual one of the nanowires is at least partially connected to a source electrode at one end and a drain electrode at another end, wherein the individual one of the nanowires has different volume dimensions than another individual one of the nanowires, and the individual one of the nanowires is configured to convert from p-type conduction to n-type conduction at a transition temperature.

An embodiment of the method for thermal history detection, among others, includes: determining a transition temperature that measures a temperature when a nanowire transitions from a p-type conduction to a n-type conduction, wherein the transition temperature is associated with a volume of the nanowire; testing a polarity of a field effect transistor comprising the volume of the nanowire; and determining whether the nanowire has been exposed to the transition temperature.

An embodiment of the matrix of field effect transistors, among others, includes: a substrate; a gate electrode positioned in proximity to the substrate; a gate dielectric displaced in proximity to a source electrode and a drain electrode; a first nanowire with a first volume dimension, wherein one end of the first nanowire is coupled to the source electrode and another end of the first nanowire is coupled to the drain electrode; and a second nanowire with a second volume dimension, wherein one end of the second nanowire is coupled to the source electrode and another end of the second nanowire is coupled to the drain electrode, wherein the first volume dimension is different from the second volume dimension, wherein the first volume dimension and the second volume dimension are associated with a transition temperature that measures a temperature when the nanowire transitions from p-type conduction to n-type conduction.

BRIEF DESCRIPTION OF DRAWINGS

Further aspects of the present disclosure will be more readily appreciated upon review of the detailed description of its various embodiments, described below, when taken in conjunction with the accompanying drawings.

FIG. 3 illustrates a thermal history device with a set of nanowire field effect transistors.

DETAILED DESCRIPTION

Figure 1:
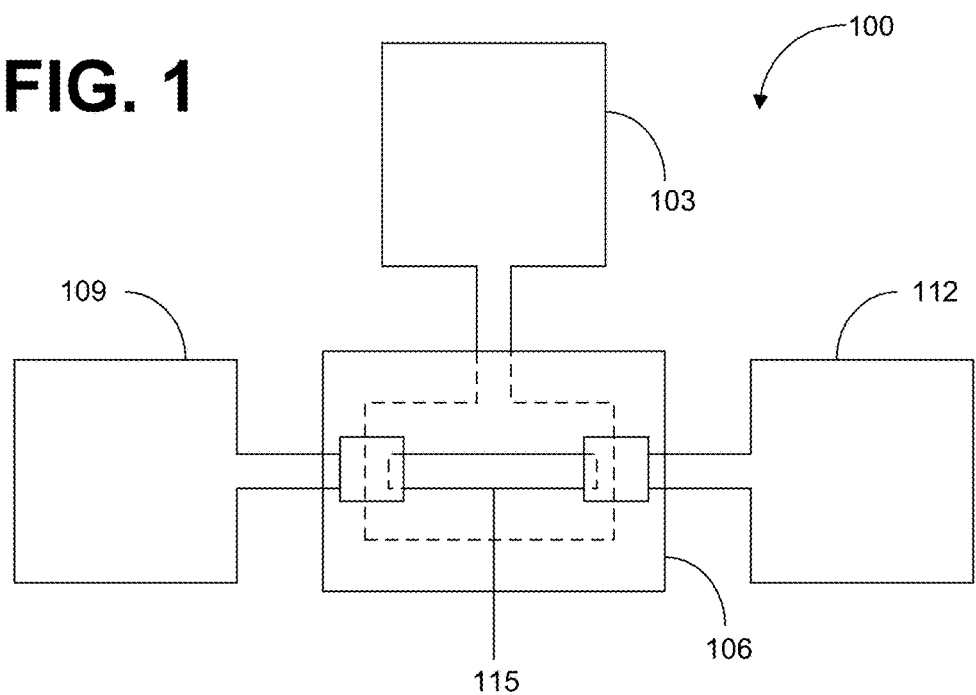
FIG. 1 illustrates a structure of a nanowire field effect transistor.

This disclosure is not limited to particular embodiments described, and as such may, of course, vary. The terminology used herein serves the purpose of describing particular embodiments only, and is not intended to be limiting, since the scope of the present disclosure will be limited only by the appended claims.

Where a range of values is provided, each intervening value, to the tenth of the unit of the lower limit unless the context clearly dictates otherwise, between the upper and lower limit of that range and any other stated or intervening value in that stated range, is encompassed within the disclosure. The upper and lower limits of these smaller ranges may independently be included in the smaller ranges and are also encompassed within the disclosure, subject to any specifically excluded limit in the stated range. Where the stated range includes one or both of the limits, ranges excluding either or both of those included limits are also included in the disclosure.

Embodiments of the present disclosure will employ, unless otherwise indicated, techniques of material science, chemistry, physics, and the like, which are within the skill of the art. Such techniques are explained fully in the literature.

The following examples are put forth so as to provide those of ordinary skill in the art with a complete disclosure and description of how to perform the methods and use the compositions and compounds disclosed and claimed herein. Efforts have been made to ensure accuracy with respect to numbers (e.g., amounts, temperature, etc.), but some errors and deviations should be accounted for. Unless indicated otherwise, parts are parts by weight, temperature is in ° C., and pressure is at or near atmospheric. Standard temperature and pressure are defined as 20° C. and 1 atmosphere.

Before the embodiments of the present disclosure are described in detail, it is to be understood that, unless otherwise indicated, the present disclosure is not limited to particular materials, reagents, reaction materials, manufacturing processes, dimensions, frequency ranges, applications, or the like, as such can vary. It is also to be understood that the terminology used herein is for purposes of describing particular embodiments only, and is not intended to be limiting. It is also possible in the present disclosure that steps can be executed in different sequence, where this is logically possible. It is also possible that the embodiments of the present disclosure can be applied to additional embodiments involving measurements beyond the examples described herein, which are not intended to be limiting. It is furthermore possible that the embodiments of the present disclosure can be combined or integrated with other measurement techniques beyond the examples described herein, which are not intended to be limiting.

It should be noted that, as used in the specification and the appended claims, the singular forms "a," "an," and "the" include plural referents unless the context clearly dictates otherwise. Thus, for example, reference to "a support" includes a plurality of supports. In this specification and in the claims that follow, reference will be made to a number of terms that shall be defined to have the following meanings unless a contrary intention is apparent.

Discussion

Embodiments of the present disclosure include nanowire field-effect transistors, systems for temperature history detection, methods for thermal history detection, a matrix of field effect transistors, and the like. In particular, embodiments of the present disclosure relate to nanowire field-effect transistors based on p-type semiconductor material tin monoxide (SnO) of different volumes to be used as thermal history sensors relying on the conversion from p-type conduction to n-type conduction.

In an embodiment, the device structure can include a substrate, either rigid like glass, or flexible like plastic; a gate electrode; a source electrode made of a conductive material; a gate dielectric; and at least one tin monoxide nanowire as an active semiconducting channel.

In an embodiment, the tin monoxide nanowire can be structured as a rectangular cross section with volume dimensions determined by a nanowire planar width, length, and thickness. In an embodiment, the tin monoxide nanowire can have a circular cross-section and have a diameter and length. The thermal history detection system disclosed can include a plurality of tin monoxide nanowire field effect transistors. Each of the nanowire field effect transistors can have at least one nanowire with different widths (or diameter for a circular cross-section) of about 10 nanometers (nm) to about 500 nm, lengths of about 1 micrometer (μm) to 10 μm, and thicknesses of about 5 nm to 50 nm. Each of the nanowires can have different widths, thicknesses, and/or lengths. Alternatively, each of the nanowires can have the same width, thickness, and/or length.

Tin monoxide is a transparent semiconducting oxide that exhibits p-type conduction. As may be appreciated, a p-type semiconducting material has a larger hole concentration than electron concentration. Such a deficiency of electrons results in the holes of the p-type semiconducting material being the major charge carriers. Alternatively, an n-type semiconducting material has a larger electron concentration than hole concentration. In the n-type semiconducting material, electrons are the major charge carriers. As may be appreciated, the major charge carriers may be primarily responsible for transporting current in a semiconductor.

Tin monoxide can be a metastable form of the tin oxides. Tin monoxide can transform into the more thermodynamically stable n-type semiconducting material tin dioxide ($SnO_2$). The temperature required to obtain this conversion can depend on the volume of the tin monoxide nanowire of the field effect transistor. Accordingly, conversion from p-type conduction to n-type conduction can be tuned by varying the width (i.e., diameter), length, and/or thickness of the nanowire in the various embodiments of the nanowire field effect transistor. The conversion from p-type tin monoxide to n-type tin dioxide can be a non-reversible reaction. Additional details are provided in the detailed description of the figures below.

FIG. 1 illustrates a structure of a nanowire field effect transistor 100. As may be appreciated, a field effect transistor can use an electric field to control the conductivity of a channel of a charge carrier in a semiconducting material. The field effect transistor can include a semiconducting channel through which charge carriers, electrons or holes, flow from a source to a drain. The semiconducting channel of a field effect transistor can be doped to produce an n-type semiconductor or a p-type semiconductor. The doping of a channel can refer to intentionally introducing impurities into a semiconducting channel for the purpose of modulating its electrical properties. Further details of n-type and p-type semiconductors are described below.

The nanowire field effect transistor 100 can be positioned on a substrate. The substrate can be made of either rigid material, like glass, or flexible material, like plastic substrates, such as polyethylene terephthalate, polyethylene naphthalate, polyimide, or other material with plastic like properties. In one embodiment, the substrate can be opaque, similar to a silicon wafer. As may be appreciated, the substrate can be made of a material suitable to hold the various embodiments of the nanowire field effect transistor disclosed herein.

In one embodiment, the nanowire field effect transistor 100 can include a gate electrode 103, a gate dielectric 106, a source electrode 109, and drain electrode 112, and at least one nanowire 115. The gate electrode 103, source electrode 109, and drain electrode 112 can be made of any conductive material, such as, but not limited to, titanium, gold, nickel, platinum, indium tin oxide, or aluminum zinc oxide. Alternatively, the gate electrode 103, source electrode 109, and drain electrode 112 can be made of films of silver nanowires or similarly structured films.

As may be appreciated, the gate electrode 103 can control the flow of electrical current between the source electrode 109 and the drain electrode 112. Specifically, the gate electrode 103 can permit electrons to flow through the nanowire field effect transistor 100. The gate electrode 103 can also block electron passage by creating or eliminating a channel between the source electrode 109 and drain electrode 112. Electrons or electron holes can flow from the source electrode 109 to the drain electrode 112 if influenced by an applied voltage.

The gate dielectric 106 can be made of a material with insulating properties, including, but not limited to, aluminum oxide, hafnium oxide, silicon nitride, strontium titanate, titanium oxide, gadolinium oxide, or any organic dielectric such as polyvinylidene difluoride, or polymethyl methacrylate. The gate dielectric 106 can be polarized by an application of an electric field. The gate dielectric 106 can be displaced between the gate and substrate in some embodiments of the disclosed nanowire field effect transistor.

The nanowire 115 can operate as the semiconducting channel of the nanowire field effect transistor 100, where the nanowire 115 functions as the channel through which electrons or electron holes flow from the source electrode 109 to the drain electrode 112. In one embodiment, the nanowire can be a transparent semiconducting oxide that exhibits p-type conduction. Specifically, the nanowire 115 can be a tin monoxide nanowire, and the fabrication of such a tin monoxide nanowire is further described below. Tin monoxide can be a metastable form of the tin oxides. The tin monoxide can transform into the more thermodynamically stable n-type semiconducting material tin dioxide ($SnO_2$). The temperature required to obtain this conversion can depend on the volume of the tin monoxide nanowire of the field effect transistor 100. Accordingly, conversion from p-type conduction to n-type conduction can be tuned by varying the width, length, and thickness of the nanowire 115 in the various embodiments of the nanowire field effect transistor 100. The conversion from p-type tin monoxide to n-type tin dioxide can be a non-reversible reaction. As may be appreciated, the nanowire 115 can be made of any other semiconducting material sufficient to function as a thermal history sensing nanowire field effect transistor according to the embodiments disclosed herein.

As may be appreciated, the tin monoxide nanowire field effect transistor can be structured as any conventional thin film transistor structure, including, but not limited to, a staggered bottom gate transistor, coplanar bottom gate transistor, staggered top gate transistor, or coplanar top gate transistor. The thermal history detection system disclosed can include a plurality of tin monoxide nanowire field effect transistors 100. Additional details and embodiments of the nanowire 115 are provided below in FIGS. 2-12 and the Examples associated with them, respectively.

Figure 2:
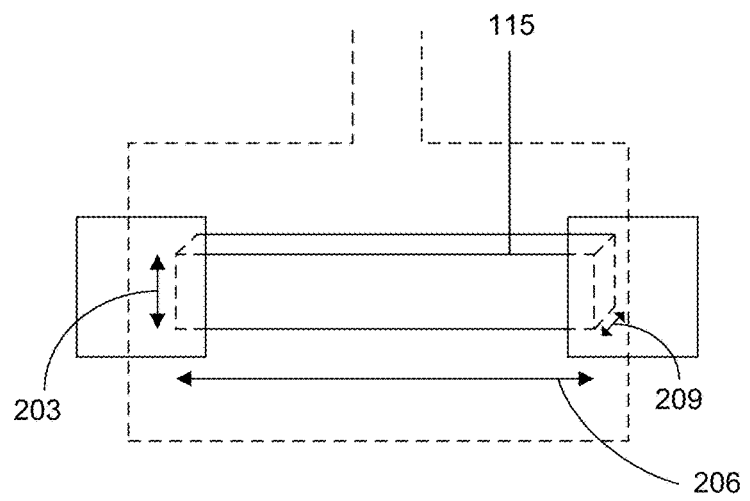
FIG. 2 illustrates the dimensions of the nanowire of the nanowire field effect transistor described in FIG. 1.

FIG. 2 illustrates the dimensions of the nanowire 115 (FIG. 1) of the nanowire field effect transistor 100 (FIG. 1) described in FIG. 1. The nanowire 115 can include a volume dimension comprising a width 203, a length 206, and a thickness 209. In one embodiment, the nanowire 115 can be a tin monoxide nanowire. As described above, in some embodiments, the tin monoxide nanowire, exhibiting p-type conduction, can undergo a phase transformation into a tin dioxide nanowire, exhibiting n-type conduction, at a certain transition temperature. A user of a thermal history device comprising a tin monoxide nanowire 115 can detect the polarity of the device to see if the maximum temperature the device has been exposed to based on the transition temperature of the nanowire 115.

Different volumes of the tin monoxide nanowire may be required to monitor the maximum temperature that the nanowire 115 has been exposed to. In an embodiment the temperature that can transform the nanowire 115 from a p-type semiconductor to an n-type semiconductor can be about 100° C. to 200° C. The volume dimension of the nanowire 115 has a direct relationship with the transition temperature required to phase transform the nanowire 115 from a p-type semiconducting material to an n-type semiconducting material. Accordingly, in one embodiment, the greater the volume dimension of the nanowire 115, the higher the transition temperature required to transform the nanowire 115 from a tin monoxide material to a tin dioxide material.

In an embodiment, the nanowire 115 can be made of any active semiconductor material. In one embodiment, the nanowire 115 can be fabricated as a tin monoxide nanowire by either physical or chemical routes including: diode/radiofrequency reactive sputtering in which in a tin monoxide film is deposited from a tin metal target in a mixed gas atmosphere containing oxygen in a vacuum chamber; radiofrequency sputtering from a tin monoxide target; pulsed laser deposition vacuum chamber either from a tin monoxide target or in a reactive process from a metal target; thermal or electron-beam evaporation of a suitable tin monoxide source; atomic layer deposition using suitable tin monoxide precursors; solution processing techniques like drop casting or spin coating of suitable tin monoxide precursors or tin monoxide solution; chemical vapor deposition techniques involving the evaporation of tin monoxide or tin dioxide, or by another means available to deposit a thin film of semiconducting material on the nanowire 115. Patterning of the tin monoxide nanowire structure can be done by electron-beam lithography to accurately control the dimensions of the tin monoxide active layer. Photolithography can be used to pattern the other components of the device structure.

FIG. 3 illustrates a thermal history device 300 with a set of nanowire field effect transistors 100 (FIG. 1). In one embodiment, the thermal history device 300 can include a plurality of nanowire field effect transistors 100 structured similar to that described in FIG. 1 and at least one gate electrode 103 (FIG. 1). Each nanowire field effect transistor 100 can include a gate dielectric 106 (FIG. 1), a source electrode 109 (FIG. 1), and drain electrode 112 (FIG. 1), and at least one nanowire 115a-e (FIG. 1). The nanowires 115a-e may each be associated with a volume dimension, similar to the volume dimensions described above in FIG. 2. As illustrated in FIG. 3, each of the nanowires 115a-e can have a different dimension from another nanowire 115a-e. For example, FIG. 3 shows nanowire 115a having a larger width than nanowire 115b and nanowire 115d. As another example, FIG. 3 shows nanowire 115c and nanowire 115e having shorter lengths than nanowire 115a. Because of each of nanowires 115a-e shown in FIG. 3 has a different volume dimension, each nanowire 115a-e can have a different transition temperature, respectively. In another embodiment, each of the nanowires 115a-e can have the same dimension as another nanowire 115a-e. The thermal history device 300 may record one or more temperatures that each nanowire 115a-e in the thermal history device 300 has been exposed to based on the transition temperature associated with the volume dimension of each nanowire 115a-e.

As may be appreciated, the set of nanowire field effect transistors 100 can be structured in various ways. In one embodiment, the nanowire field effect transistors 100, each with a gate electrode 103, a gate dielectric 106, a source electrode 109, and drain electrode 112, and at least one nanowire 115, can be positioned separately in varying and/or distant locations throughout an item or substrate. Alternatively, a plurality of source electrodes 109, drain electrodes 112, and nanowires 115 can be displaced upon one gate dielectric 106 in proximity to one gate electrode 103 on a substrate. In another embodiment and as depicted in FIG. 3, one gate electrode 103 can supply the voltage to a plurality of interconnected gate dielectrics 106, source electrodes 109, drain electrodes 112, and nanowires 115.

In some embodiments, each of the nanowire field effect transistors 100 can include a plurality of nanowires 115 structured as a stack or in any way such that each nanowire 115 is coupled to one source electrode 109 and drain electrode 112 in proximity to a gate dielectric 106 and gate electrode 103. The plurality of nanowire field effect transistors 100 disclosed can be structured as an array, as shown in FIG. 3, a matrix, or in any random or sequenced structure. As may be appreciated, the structure of the nanowire field effect transistor 100 can be any conventional thin film transistor structure, including, but not limited to, a staggered bottom gate transistor, coplanar bottom gate transistor, staggered top gate transistor, or coplanar top gate transistor.

In an embodiment, the thermal history device 300 disclosed may or may not require power to operate. The thermal history device 300 can be fully transparent and can include either rigid or flexible substrates that can be easily attached to a product where a temperature exposure record is needed. The inexpensive thermal history device 300 can be used to monitor a maximum temperature a product has been exposed to during production, transportation, or storage based on the transition temperature of the nanowire 115 associated with the thermal history device 300.

Figure 4A:
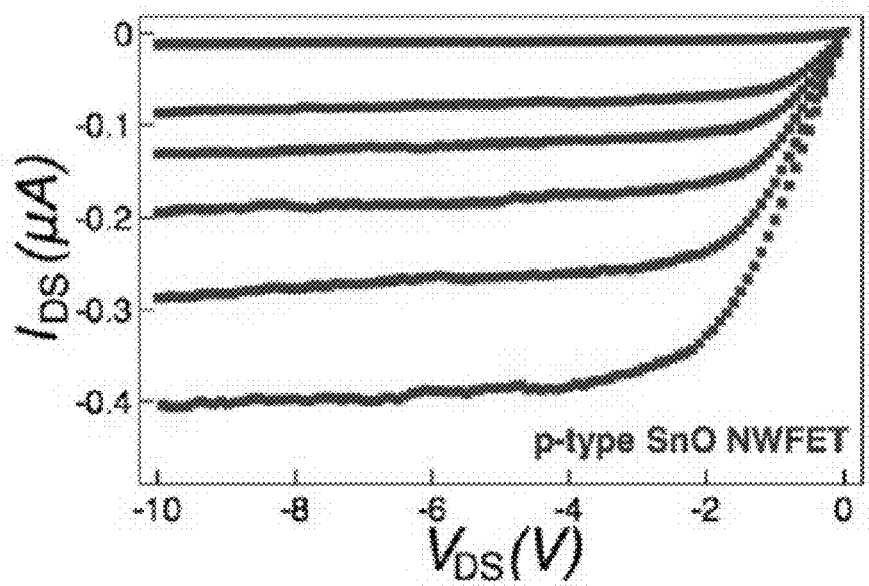
FIG. 4A is a graph illustrating output characteristics of the nanowire field effect transistor described in FIG. 1 exhibiting p-type conduction.
Figure 4B:
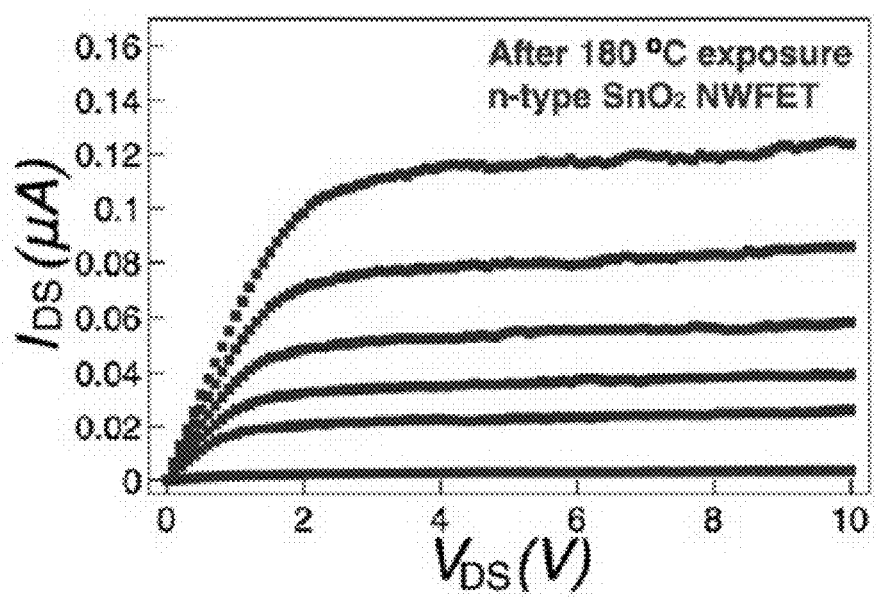
FIG. 4B is a graph illustrating output characteristics of the nanowire field effect transistor device described in FIG. 4A exhibiting n-type conduction as a result of a phase transformation.

FIGS. 4A-B show the electrical characterization of a nanowire field effect transistor 100 (FIG. 1) showing the transition from p-type to n-type conduction after being exposed to a given temperature. Specifically, FIG. 4A is a graph depicting output characteristics of a tin monoxide nanowire field effect transistor showing p-type conduction before being exposed to the transition temperature required to transform the tin monoxide nanowire into a tin dioxide nanowire. As illustrated in FIG. 4A, the tin monoxide nanowire exhibits p-type conducting carrying a negative source to drain current.

Next, FIG. 4B illustrates output characteristics of the same nanowire field effect transistor 100 (FIG. 1) after being exposed to 180° C. showing n-type conduction as a result of tin monoxide to tin dioxide phase transformation. The tin monoxide nanowire underwent a phase transformation due to exposing the nanowire 115 (FIG. 1) to the transition temperature of 180° C., resulting in a positive source to drain current indicated in FIG. 4B. The tin monoxide nanowire may have been of a certain volume dimension that required the tin monoxide to be exposed to 180° C. to undergo phase transformation into tin dioxide.

Figure 5:
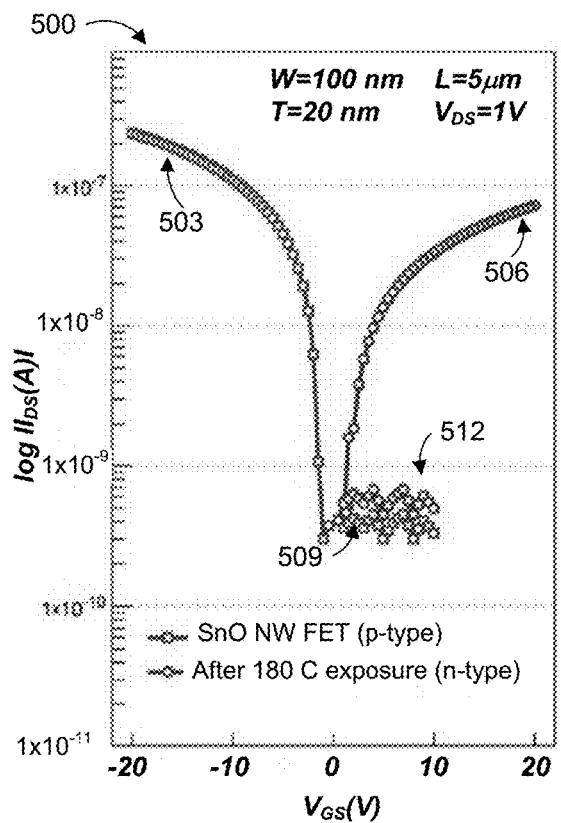
FIG. 5 is a graph illustrating the transfer characters of the nanowire field transistor described in FIG. 1.

FIG. 5 is a graph 500 illustrating an example of transfer characteristics of nanowire field effect transistor 100 (FIG. 1) having a nanowire 115 (FIG. 1) with a width 203 (FIG. 2) of 100 nm, a length 206 (FIG. 2) of 5 µm, and a thickness 209 (FIG. 2) of 20 nm. Transfer characteristics graph 500 includes a tin monoxide plot 503, a tin dioxide plot 506, a tin monoxide leakage 509, and a tin dioxide leakage 512. The tin monoxide plot 503 shows the initial negative gate voltage. The tin dioxide plot 506 shows a positive gate voltage that resulted from the tin monoxide nanowire being exposed to the transition temperature of 180° C. As illustrated in FIG. 5, tin monoxide leakage 509 and tin dioxide leakage 512 indicate that gate leakage currents are very low in some embodiments. Graph 500 may further illustrate the polarity change that can result from exposing the nanowire 115 to a pre-determined transition temperature.

Figure 6:
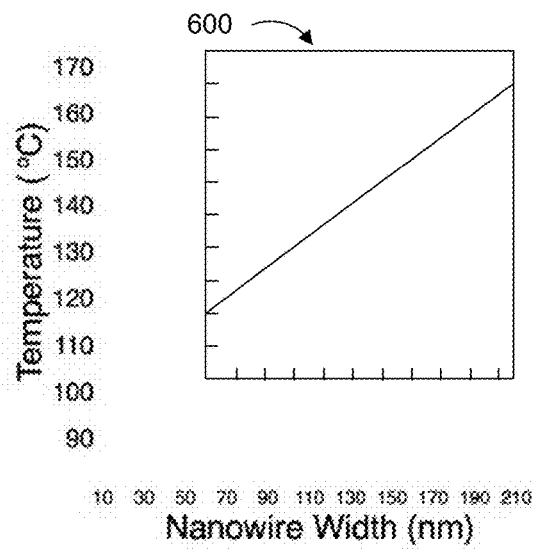
FIG. 6 is a graph illustrating a phase transformation transition temperature as a function of nanowire volume dimensions.

FIG. 6 shows a graph of p-type tin monoxide to n-type tin dioxide transition temperatures as a function of nanowire 115 (FIG. 1) with a width 203 (FIG. 2) of about 100 nm, a length 206 (FIG. 2) of about 2 µm and a thickness 209 (FIG. 2) of about 10 nm. The transition temperature is a temperature at which a nanowire 115 of a nanowire field effect transistor 100 (FIG. 1) transitions from p-type conduction to n-type conduction. The transition temperature of a nanowire 115 is associated with a volume dimension of the nanowire 115. The volume dimension can include a width 203, a length 206, and a thickness 209. The volume dimension of the nanowire 115 can have a direct relationship with the transition temperature required to phase transform the nanowire 115 from a p-type semiconducting material to an n-type semiconducting material.

Accordingly, in one embodiment, the greater the volume dimension of the nanowire 115, the higher the transition temperature required to transform the nanowire 115 from a tin monoxide material to a tin dioxide material. FIG. 6 illustrates a specific embodiment of this concept by showing the transition temperature as a function of the nanowire width 203 while keeping the length 206 and thickness fixed 209. Other transition temperatures can be obtained by varying the length 206 or the thickness 209 of the nanowire.

In one embodiment including a matrix of nanowire field effect transistors 100 (FIG. 1), it is possible to detect the maximum temperature the thermal history device has been exposed to by identifying the conduction polarity of the nanowire 115 (FIG. 1) in the nanowire field effect transistors 100. The nanowire field effect transistor 100 can be designed with pre-configured volume dimensions to convert from p-type conduction to n-type conduction at a pre-determined transition temperatures based on the volume dimensions. For example, a tin monoxide nanowire can convert to a tin dioxide nanowire at a specific transition temperature. A tin monoxide nanowire having a first volume dimension can convert to a tin dioxide nanowire at a different transition temperature than another tin monoxide nanowire having a second volume dimension. By testing the polarity of the nanowire 115, it is possible to determine if nanowire 115 has been exposed to the transition temperature.

The thermal history device 300 can also be configured to programmatically determine whether each nanowire 115 is exhibiting p-type conduction or n-type conduction. In one embodiment, the thermal history device 300 can physically record the polarity of each nanowire. For example, a physical indicator in proximity to each nanowire 115 can display one color to indicate that the nanowire 115 is exhibiting p-type conduction or display another color to indicate that the nanowire 115 is exhibiting n-type conduction. The user can then determine whether the nanowire 115 has been exposed to the transition temperature based on the color of the physical indicator alone.

In another embodiment, the thermal history device 300 can be configured to automatically detect when each nanowire 115 converts from p-type conduction to n-type conduction. The thermal history device 300 can include a physical indicator representing whether the nanowire 115 has undergone phase transformation from a p-type semiconducting material to an n-type semiconducting material. In such an embodiment, a user of the thermal history device may not need to detect the polarity of each nanowire to determine if the nanowire 115 has been exposed to the transition temperature. Rather, the user of the thermal history device 300 can determine whether the nanowire 115 has been exposed to the transition temperature by looking at the physical indicator representing such phase transformation for each nanowire.

In one embodiment, the thermal history device can include a programmable device allowing the user to set a notification when a given maximum temperature has been reached. Such notification can include a flashing light and/or sound alarm that activates when the transition temperature has been reached.

In some embodiments, the thermal history device 300 can additionally include a timing recorder that records a time at which the nanowire 115 transformed from a p-type semiconductor to an n-type semiconductor. For example, suppose the thermal history device 300 is configured to automatically determine whether each nanowire 115 is exhibiting p-type conduction or n-type conduction. The thermal history device 300 can include a clock that is configured to record the time at which the thermal history device 300 determined that the nanowire 115 converted from p-type conduction to n-type conduction. Therefore, the user of the thermal history device 300 can look at the physical indicator and the timing recorder to determine when the nanowire 115 was exposed to the transition temperature associated with the volume dimension of the nanowire 115.

Figure 7:
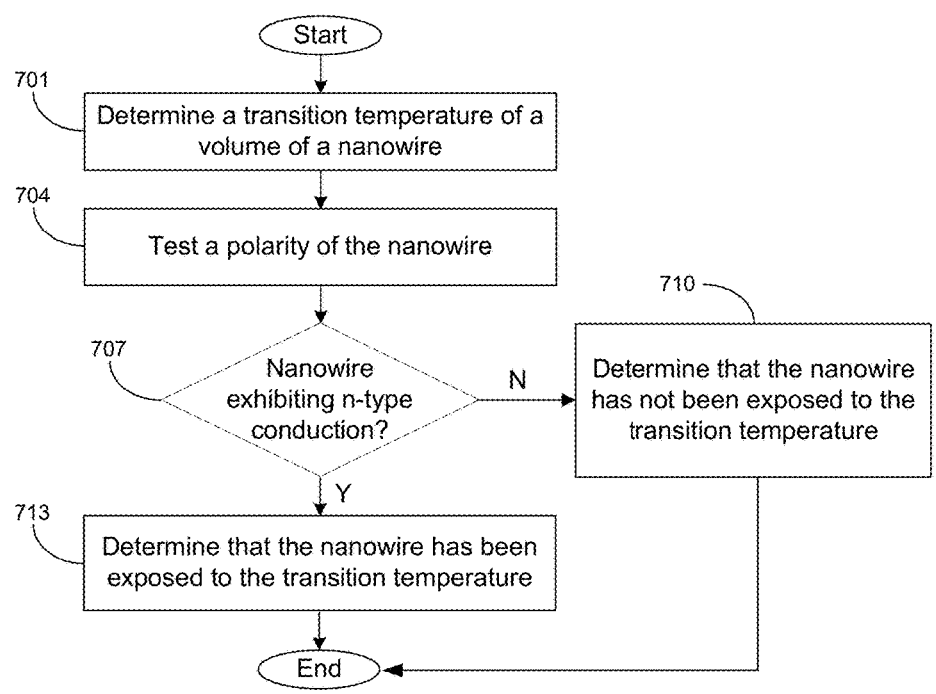
FIG. 7 is a flowchart illustrating one example of a functionality implemented by a user of a thermal history device comprising at least one nanowire according to various embodiments of the present disclosure.

FIG. 7 is a flowchart illustrating one example of a functionality implemented, by a user, thermal history device including at least one nanowire according to various embodiments of the present disclosure. It is understood that the flowchart of FIG. 7 provides merely an example of many different types of functional arrangements that can be employed to implement the operation of the portion of the securing device as described herein. As an alternative, the flowchart of FIG. 7 can be viewed as depicting an example of steps and methods implanted by the user according to one or more embodiments. For example, a user of some embodiments of the disclosed thermal history device can be a plastic water bottle transporter that is required to report the maximum temperature that the plastic water bottles have been exposed to.

The user of the thermal history device can begin in box 701, by determining a transition temperature of a volume dimension of a nanowire 115 (FIG. 1). For example, similar to the embodiment of the nanowire field effect transistor 100 described in FIG. 5, a nanowire 115 made of tin monoxide can have a width 203 of 100 nm, a length 206 of 5 μm, and a thickness 209 (FIG. 2) of 20 nm. Such a nanowire 115 can be associated with a transition temperature of 180° C. measuring the requisite temperature exposure for a phase transformation. Next, in box 704, the user may test the polarity of the nanowire 115 to determine whether the nanowire exhibits n-type conduction or p-type conduction, as depicted in box 707. If the user determines that the nanowire 115 is not exhibiting n-type conduction, as shown in box 710, then the user can recognize that the nanowire 115 is still exhibiting p-type conduction and has not undergone phase transformation. Thus, the user can determine that the nanowire has not been exposed to the transition temperature. Alternatively, if the user determines that the nanowire 115 is exhibiting n-type conduction, as shown in box 713, then the user can determine that the nanowire 115 has undergone phase transformation and thus has been exposed to the transition temperature. After which the process ends.

For example, suppose the user of the thermal history device is testing the polarity of a nanowire 115 described above, wherein the nanowire 115 is made of tin monoxide, has a width 203 of 100 nm, a length 206 of 5 μm, and a thickness of 20 nm, and has a transition temperature of 180° C. The user of the thermal history device 300 can test the polarity of the nanowire 115 to determine whether it is exhibiting n-type conduction or p-type conduction. If the nanowire 115 is still a tin monoxide nanowire exhibiting p-type conduction, then the user can determine that the nanowire 115 has not been exposed to the transition temperature of 180° C. Alternatively, if the nanowire 115 is now a tin dioxide nanowire exhibiting n-type conduction, then the user can determine that the nanowire 115 has been exposed to the transition temperature 180° C. because of the phase transformation that occurred.

EXAMPLE

Now having described the embodiments of the disclosure, in general, the example describes some additional embodiments that may represent methods and systems relating to field-effect transistors used for thermal history detection. While embodiments of the present disclosure are described in connection with the example and the corresponding text and figures, there is no intent to limit embodiments of the disclosure to these descriptions. On the contrary, the intent is to cover all alternatives, modifications, and equivalents included within the spirit and scope of embodiments of the present disclosure.

Example 1

Oxide semiconductors hold great promise as materials for use in many emerging electronic applications. Such applications include transparent and flexible displays, sensor arrays, flexible solar cells, and logic circuitry for so-called invisible electronics. The use of oxide based thin-film transistors (TFT) has already been shown as a good solution to the increasingly demanding requirements of better display technologies. For example, transparent amorphous In—Ga—Zn—O with a mobility of 10 cm$^2$ V$^{-1}$ s$^{-1}$ has been demonstrated to be useful in switching/driving TFTs in the next generation of flat panel and flexible displays. Outstanding TFT results have been reported for display applications based on various oxide-based semiconducting films, although all such materials are based on n-type semiconductors. A p-type oxide with comparable performance (mobility, current-carrying capacity, optical transparency and mechanical flexibility) to that of previously developed n-type transparent semiconducting oxides not only will allow the realization of better display technologies but also will usher in a new era of transparent electronics.

The limiting factor for the full integration of oxide based devices, however, continues to be the development of a p-type oxide material with performance comparable to that of the n-type oxides. Cu-based oxides have been demonstrated to exhibit p-type behavior. The best performance ($\mu_{FE}$=4.3 cm$^2$ V$^{-1}$ s$^{-1}$) has been exhibited when Cu$_2$O is deposited at 500° C. Despite their high hole mobility, Cu$_2$O-based oxides are of limited use because its optical transparency is hindered by their low optical bandgap of 2.2 eV. If plastic and other flexible substrates are the ultimate goal, low processing temperatures are essential. Recently, devices based on p-type tin monoxide (SnO) have been developed, but again their use is limited by either high deposition temperatures or low $\mu_{FE}$ similar to a-Si:H. Not even Hall-effect mobility ($\mu_{Hall}$) in the range of n-type amorphous oxide semiconductors (10 cm$^2$ V$^{-1}$ s$^{-1}$) has been reported for SnO, preventing its use in practical applications.

Results and Discussion
Film Characterization.

The pathway to achieve high mobility involved a large number of experimental studies, each repeated several times, in which we carefully mapped out a very wide process window in our reactive DC magnetron sputtering process. It is known that Sn metal occurs in two possible oxidation states (2+ and 4+), with SnO$_2$(4+) being the most thermodynamically stable phase. SnO is a metastable phase that easily oxidizes to n-type SnO$_2$. It is also known that depositing the correct p-type phase of SnO by physical vapor deposition is challenging due to the required fine control of oxygen pressure to prevent the formation of SnO$_2$ or any other intermediate phases such as Sn$_2$O$_3$ or Sn$_3$O$_4$ with n-type characteristics. In our extensive experimental studies, we have found that the p-type transport in tin monoxide occurs only in a very narrow window of deposition conditions. This window occurs when the relative oxygen partial pressure ($O_{PP}$) [where $O_{PP}=P_{O2}/(P_{O2}+P_{Ar})$] and deposition pressure (P) lie within the process boundaries illustrated by the bold black lines in FIG. 8A. Specifically, p-type tin monoxide transport occurs in the process regime where 7%≤$O_{PP}$15% and 1.5 mTorr≤P≤2 mTorr. For the case where P is >2.0 mTorr or $O_{PP}$>15%, either amorphous phase or SnO$_2$ is formed. Pan and Fu have shown that in the presence of excess oxygen (and temperature), the metastable SnO phase transforms to SnO$_2$ via a process initiated by the local disproportionate redistribution of internal oxygen, known as the disproportionation mechanism. In the first step of the oxidation process the metastable SnO phase coexists with intermediate products such as Sn$_3$O$_4$ and Sn, then the inward diffusion of external oxygen causes the full oxidation into the thermodynamically stable SnO$_2$ phase. In our films, the observation of an amorphous phase when P>2.0 mTorr and 15%≤$O_{PP}$<20% indicates that at these conditions the oxygen concentration is high enough not to form p-type SnO, but the thermal budget is not enough to crystallize the intermediate product (Sn$_3$O$_4$), or its diffraction intensity is too low to be detected by our tool. At higher $O_{PP}$ (>20%) oxygen content is enough to directly crystallize the films into SnO$_2$ phase after annealing. When $O_{PP}$<7% and/or P<1.5 mTorr, metallic tin (β-Sn) is the dominant phase and the films exhibit either metallic or weak n-type conduction. In this study, all the samples were deposited at room temperature following a postannealing treatment in air, in a tube furnace at 180° C. for 30 min.

Figure 8B:
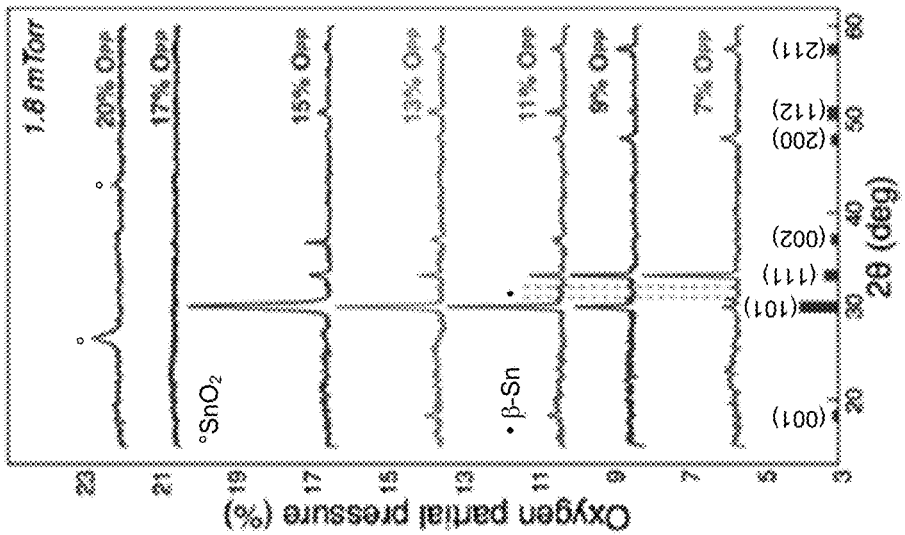
FIG. 8B illustrates X-ray diffraction (XRD) patterns showing tin monoxide phase formation dependence.
Figure 8A:
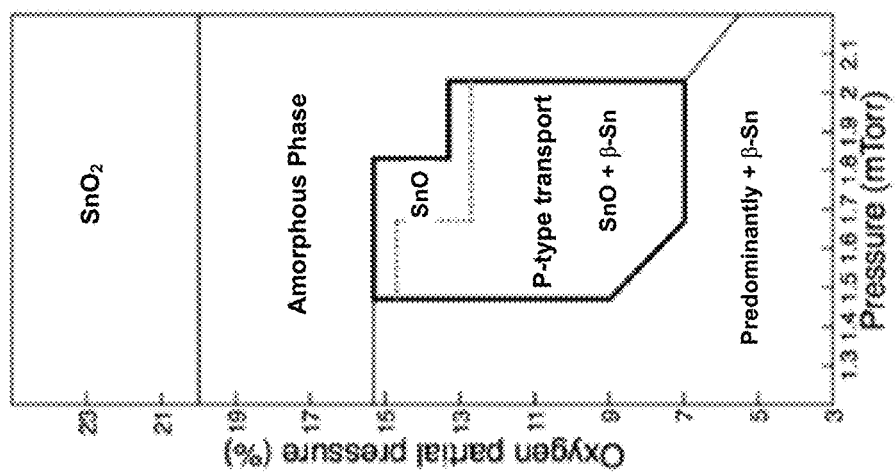
FIG. 8A is a phase stability map to obtain p-type tin monoxide.
Figure 8D:
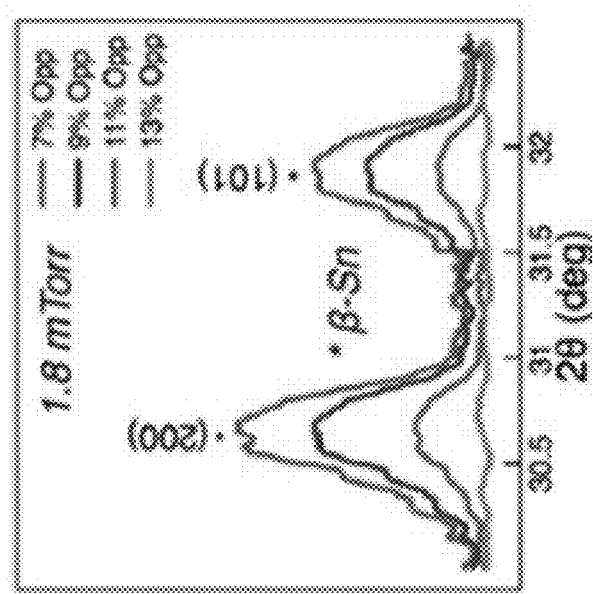
FIG. 8D illustrates the XRD patterns described in FIG. 8C in a narrower range.
Figure 8C:
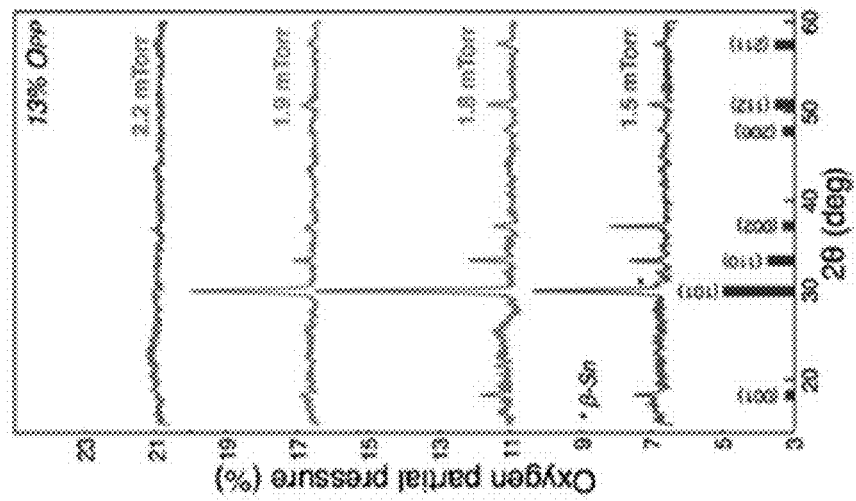
FIG. 8C illustrates XRD patterns showing depositions pressure dependence.

The X-ray diffraction (XRD) patterns in FIG. 8B show the dependence of phase formation on the oxygen partial pressure ($O_{PP}$) at a deposition pressure (P) of 1.8 mTorr, as an example. As indicated in FIG. 8A, films deposited at 7%≤$O_{PP}$≤11% show the presence of small traces of β-Sn in a matrix of SnO (this mixture is henceforth referred to as mixed phase SnO or mp-SnO), while films deposited at 13%≤$O_{PP}$≤15% comprise pure tetragonal SnO. The Sn metal was uniformly distributed in the SnO matrix as seen in plane view transmission electron microscopy and as reflected by the excellent device uniformity, which will be discussed later on. Films deposited at higher $O_{PP}$ form either amorphous SnO phase (a-SnO) (e.g., 17% $O_{PP}$) or SnO$_2$ (e.g., 20% $O_{PP}$). Further, we found that the tin oxide phase formation (SnO, mp-SnO, a-SnO, or SnO$_2$) is extremely sensitive to the deposition pressure. FIG. 8C shows the influence of the deposition pressure on the SnO phase formation at 13% $O_{PP}$. A pure polycrystalline SnO phase is obtained in the deposition pressure range of 1.7 mTorr to 2.0 mTorr. As the deposition pressure increases, the intensity of the SnO diffraction peaks increases up to P=1.8 mTorr and then decreases at P=1.9 mTorr to completely vanish at P≥2.0 mTorr, indicating the formation of amorphous films. The $O_{PP}$ is not only crucial to control which oxide phase will form, but also to control the amount of metallic tin present in the films. FIG. 8D shows XRD patterns in a narrower 2θ range to clarify how the diffraction intensity of the β-Sn decreases as a function of $O_{PP}$ at 1.8 mTorr, which turned out to be the optimal deposition pressure for device performance as discussed below. X-ray photoelectron spectroscopy (XPS) analysis was used to estimate the metallic tin content in the mp-SnO films. For the 1.8 mTorr deposition pressure, as the relative oxygen partial pressure ($O_{PP}$) was reduced from 15% to 7%, the amount of metallic tin in the films increased from undetectable by XPS to nearly 5 atom %.

Noticeable differences in the intensities of the (101) and (110) diffraction peaks are observed with increasing $O_{PP}$ (FIG. 8B). The difference in intensities of the XRD peaks can have many origins, such as crystallite size, lattice defects, and preferential crystallite orientation. We have identified preferential crystallite orientation (by pole density calculations) as well as lattice defects (by strain analysis) to be the main causes of the intensity differences.

Figures 9A, 9B:
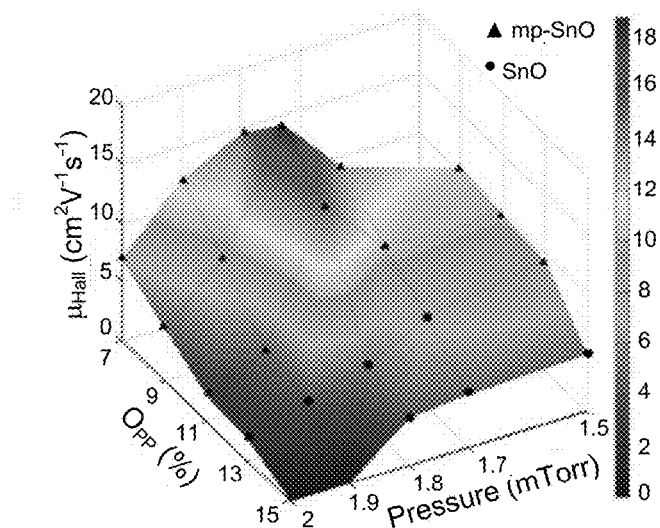
FIG. 9A is a graph illustrating room temperature Hall mobility of films deposited in a pressure range.
FIG. 9B is a table that illustrates further details of the Hall mobility, carrier density, and film conductivity shown in FIG. 9A.

FIG. 9A is a graph illustrating room temperature Hall mobility of the films deposited in the pressure range from 1.5 to 2.0 mTorr and 7% to 15% $O_{PP}$. The point at 7% $O_{PP}$, 1.5 mTorr showing n-type conduction as well as the 15% $O_{PP}$ at 1.9 mTorr and 2.0 mTorr showing unreliable measurements, are set to zero. A maximum Hall mobility of 18.7 cm$^2$ V$^{-1}$ s$^{-1}$ is obtained at 1.8 mTorr, 9% $O_{PP}$.

Room-temperature Hall effect measurements are summarized in the three-dimensional plot depicted in FIG. 9A. The plot summarizes the effect of the process parameters discussed above on the Hall mobility of the films. As shown in FIG. 8A, films deposited in the range of 7%≤$O_{PP}$≤15% and a deposition pressure of 1.5 to 2.0 mTorr exhibit p-type behavior (a positive Hall effect coefficient). Films processed using conditions outside this window showed n-type or metallic behavior in accordance with the phase map in FIG. 8A. According to FIG. 9A, a maximum Hall mobility ($\mu_{Hall}$) of 18.7 cm$^2$ V$^{-1}$ s$^{-1}$ is obtained for the films deposited at 1.8 mTorr and 9% $O_{PP}$, which surprisingly does not correspond to pure SnO films, but to the mixed phase ones (mp-SnO). The maximum $\mu_{Hall}$ obtained in this study is 8 times higher than the value reported for single-phase (001) epitaxial SnO and is of sufficiently large value that practical applications can be realized. The measured carrier density ranges from 4.83×10$^{16}$ cm$^{-3}$ to 3.33×10$^{17}$ cm$^{-3}$, which is in the range of previously observed p-type SnO. Details of the Hall mobility, carrier density, and film conductivity are shown in Table 1 depicted in FIG. 9B.

Device Characterization.

Figure 10A:
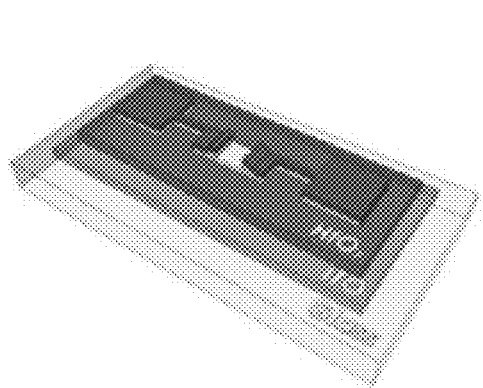
FIGS. 10A-D illustrate conceptual designs of fabricated devices of the various embodiments disclosed herein.
Figure 10B:
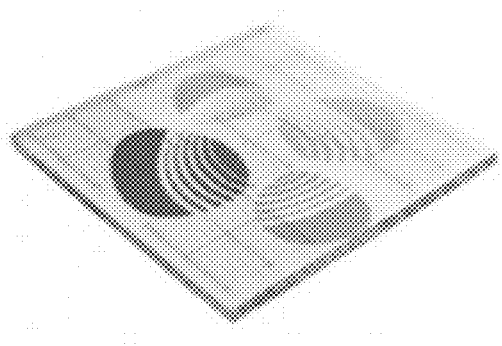
Figure 10C:
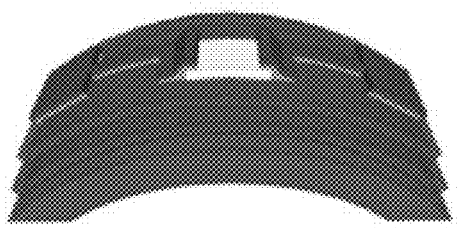
Figure 10D:
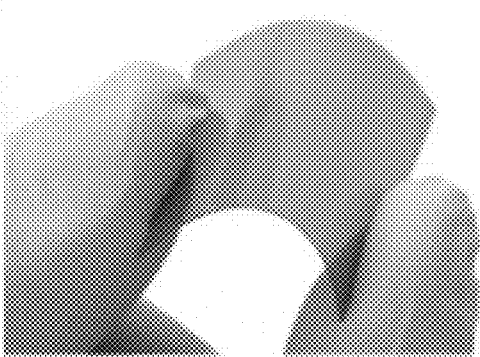
Figure 11A:
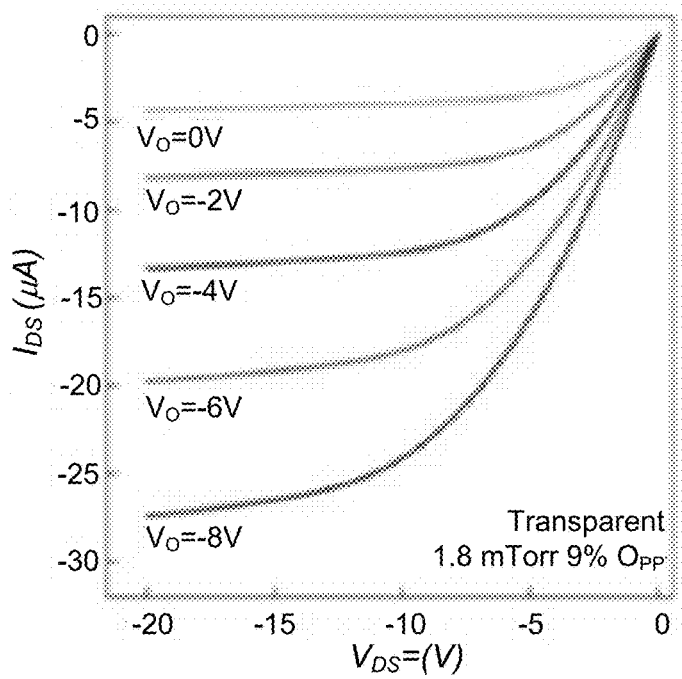
FIGS. 11A-B are graphs illustrating output and transfer characteristics of thermal history devices fabricated on a fully transparent material.
Figure 11B:
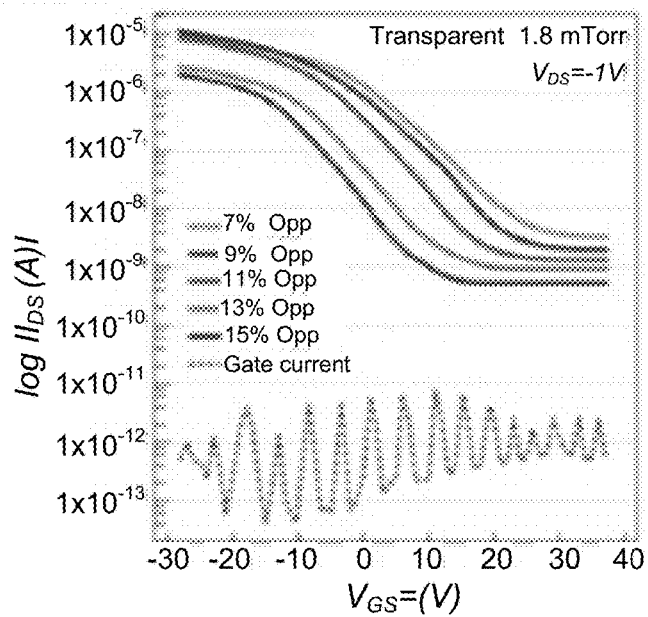
Figure 11C:
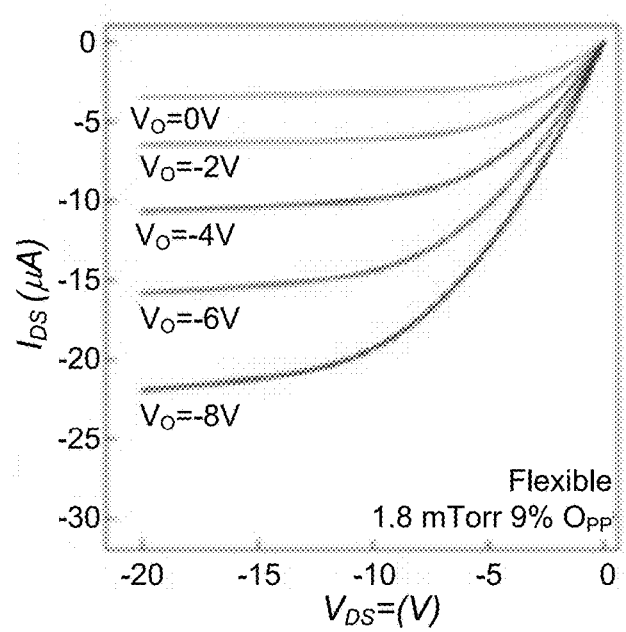
FIGS. 11C-D are graphs illustrating output and transfer characteristics of thermal history devices fabricated on a flexible material.
Figure 11D:
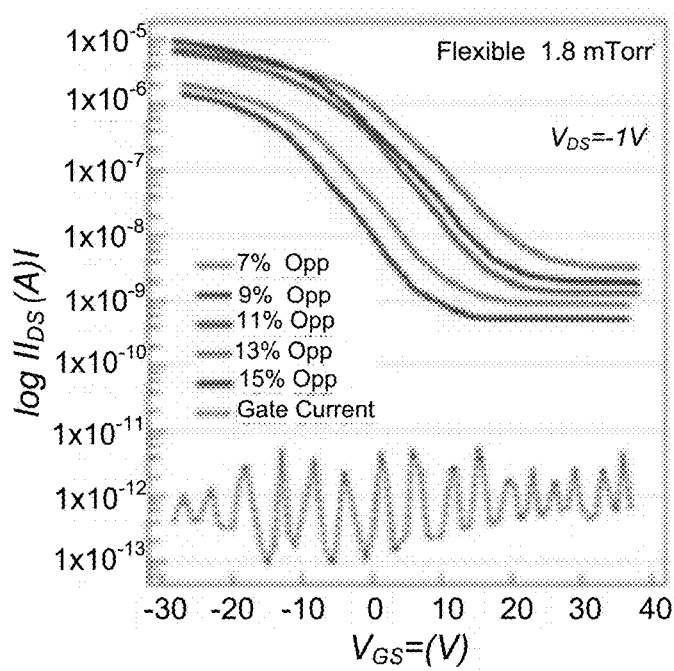

The conceptual design of the fully transparent and flexible devices is depicted in FIGS. 10A and 10C, respectively, whereas FIGS. 10B and 10D show the actual fabricated devices. FIGS. 11A and 11C depict the output characteristics of fully transparent and flexible devices produced at 9% $O_{PP}$, P=1.8 mTorr, respectively, in which clear linear and saturation regions can be observed. The absence of current crowding at low source-to-drain voltages ($V_{DS}$) indicates an Ohmic contact of Ti/ITO with SnO. FIGS. 11B and 11D present the transfer characteristics measured with $V_{DS}$=−1 V for devices produced at 1.8 mTorr with different $O_{PP}$. In all cases, p-type behavior is observed, since the holes are generated at negative gate voltages ($V_{GS}$). FIGS. 11B and 11D also show that the gate leakage currents are very low and are around $10^{-12}$ amps.

Figure 12A:
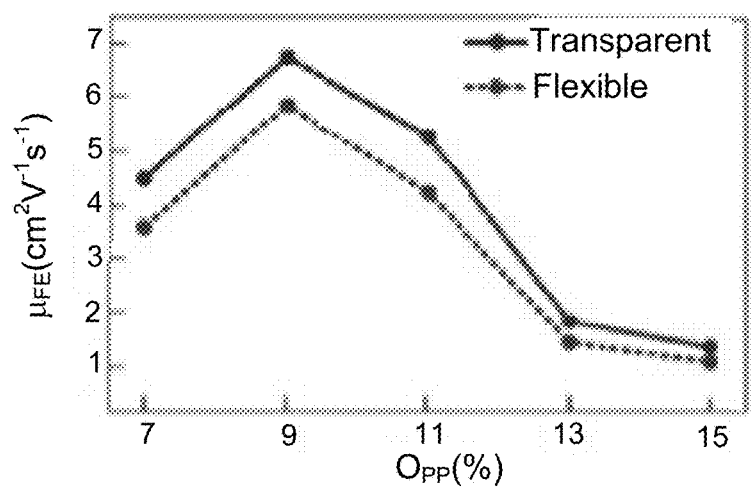
FIG. 12A is a graph illustrating linear field effect mobility as a function of oxygen partial pressure.
Figure 12B:
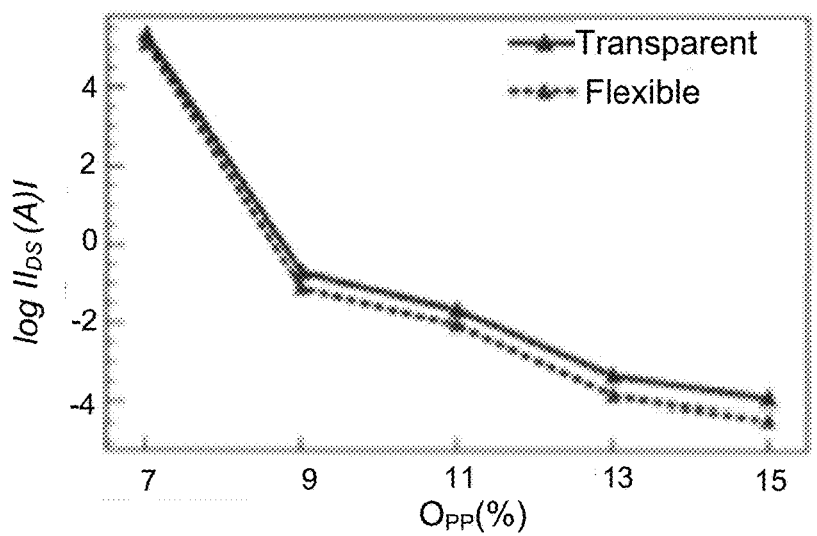
FIG. 12B is a graph illustrating threshold voltage comparison for fully transparent and flexible devices.
Figure 12C:
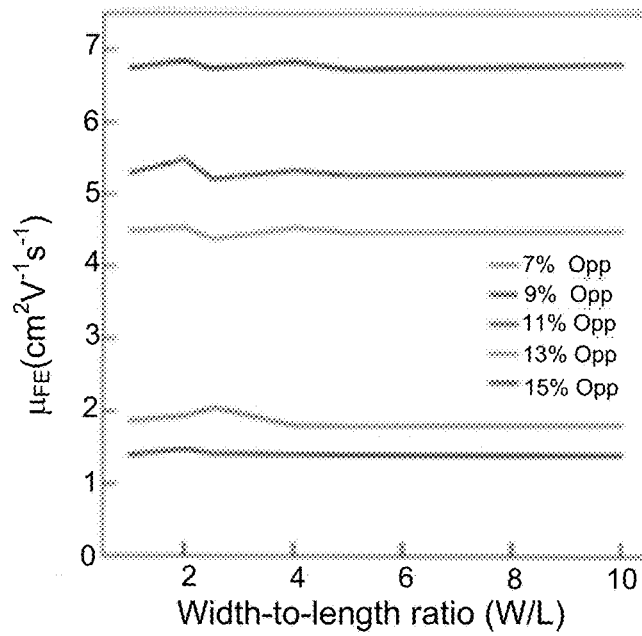
FIG. 12C is a graph illustrating linear field effect mobility as a function of width-to-length ratios for transparent devices.
Figure 12D:
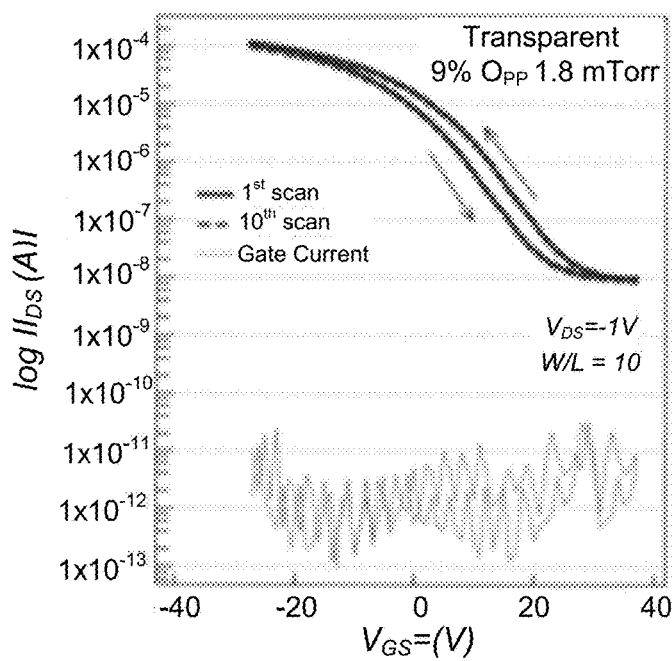
FIG. 12D is a graph illustrating multiple, dual sweep transfer curves for a thermal history device.
Figure 12E:
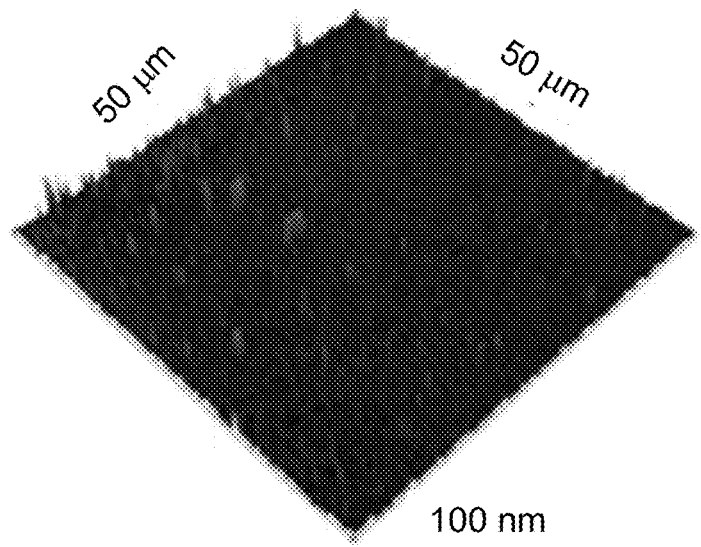
FIGS. 12E-F illustrate atomic force microscopy surface profiles for glass and plastic substrates, respectively.
Figure 12F:
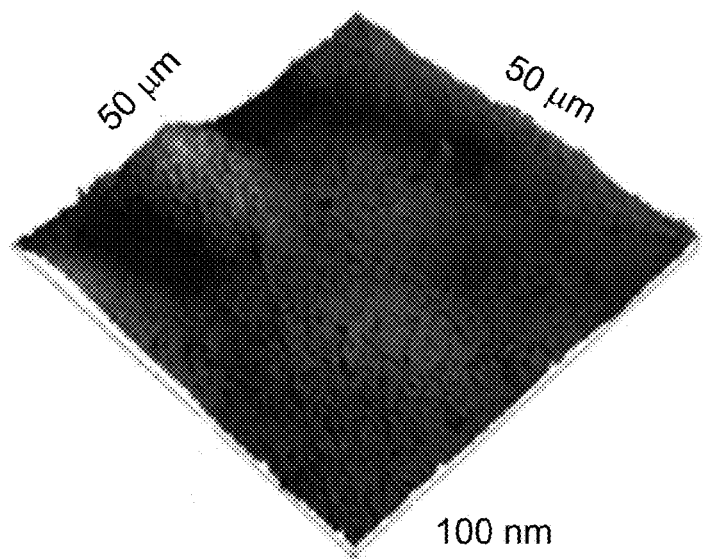

FIG. 12A is a graph illustrating the linear field-effect mobility ($\mu_{FE}$) as a function of $O_{PP}$ for the devices fabricated for this study at P=1.8 mTorr. FIG. 12B is a graph illustrating the threshold voltage ($V_T$) comparison of the fully transparent and flexible devices. FIG. 12C is a graph illustrating the linear field-effect mobility as a function of width-to-length ratio for the transparent samples. FIG. 12D is a graph illustrating multiple, dual-sweep transfer curves for a device with a W/L=10 at the best performance condition (9% $O_{PP}$, 1.8 mTorr). FIGS. 12E and 12F show atomic force microscopy (AFM) surface profiles for the mp-SnO films deposited on glass and polyimide substrates, respectively.

Linear-region field-effect mobility ($\mu_{FE}$) and threshold voltage ($V_T$) were calculated from the transfer characteristics and the obtained values are shown in FIGS. 12A and 12B, respectively. To rule out any artifacts in the TFT measurements, all the devices were characterized following the procedure recommended by J. F. Wager with multiple W/L ratios. The mobility data shown in FIG. 12A were extracted from devices with W/L=1, but W/L ratios from 1 to 10 were tested and gave very similar results as shown in FIG. 12C for the set of fully transparent devices. Multiple, dual sweep $I_{DS}$ vs $V_{GS}$ scans were performed, and it was found that the devices belong to type II in Wager's classification which is nonequilibrium, steady-state behavior. An effective hysteresis density of NHYS=1.8645×10$^{12}$ cm$^{-2}$ with a threshold voltage shift of 3.67 V at a $V_{GS}$ scan rate SR=366 mV/s is observed for the best performance device (9% $O_{PP}$, 1.8 mTorr) as shown in FIG. 12D with a W/L ratio of 10. The transparent TFTs on glass have a maximum $\mu_{FE}$ of 6.75 cm$^2$ V$^{-1}$ s$^{-1}$ while the mobility is nearly 20% lower for the TFTs made on flexible substrates. Results of SnO surface inspection by atomic force microscopy using the same area as in actual devices (50 μm×50 μm) are presented in FIGS. 12E and 12F for glass and plastic substrates, respectively. It is evident that the mixed phase (mp-SnO) films deposited on flexible substrates have a higher surface roughness. The lower mobility of devices on flexible polyimide substrate can thus be attributed to the higher surface roughness of this substrate, which increases carrier scattering and hence reduces the mobility. For all $O_{PP}$ conditions, the $I_{ON}/I_{OFF}$ ratio is around $10^3$, leading to a maximum of 6×10$^3$ for the device with highest mobility.

As expected, devices produced at different $O_{PP}$ exhibit different behaviors. $\mu_{FE}$ follows a similar trend to that of $\mu_{Hall}$ shown in FIG. 9A. The hole mobility reaches its maximum in case of devices (and films) deposited at 9% $O_{PP}$, 1.8 mTorr, which corresponds to the mp-SnO films with ~3 atom % Sn.

Figure 13A:
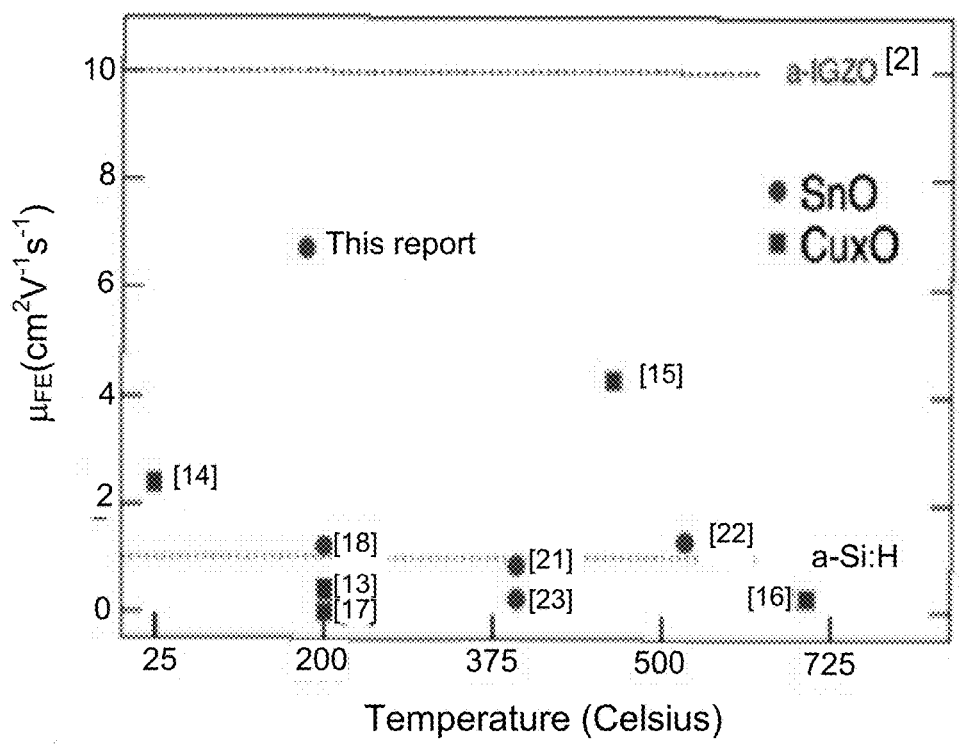
FIG. 13A is a graph illustrating a comparison of reported field effect mobility versus maximum processing temperature for leading p-type oxides.
Figure 13B:
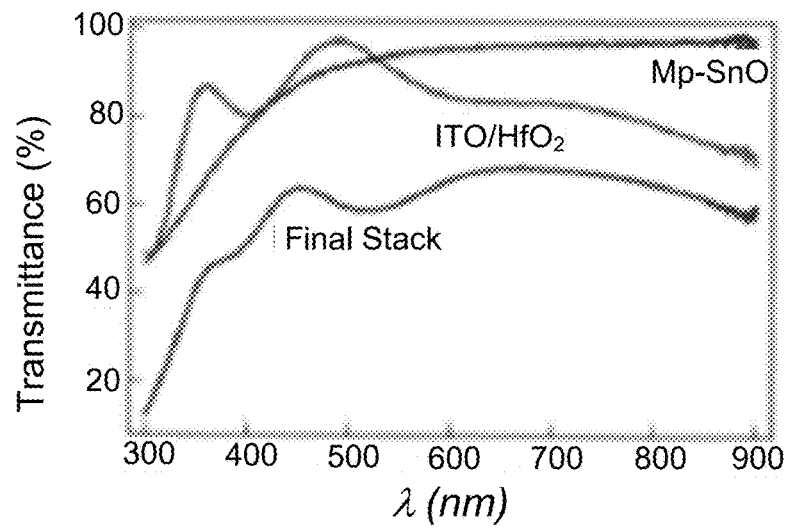
FIG. 13B is a graph illustrating transmission spectra of components of a thin film transistor.
Figure 13C:
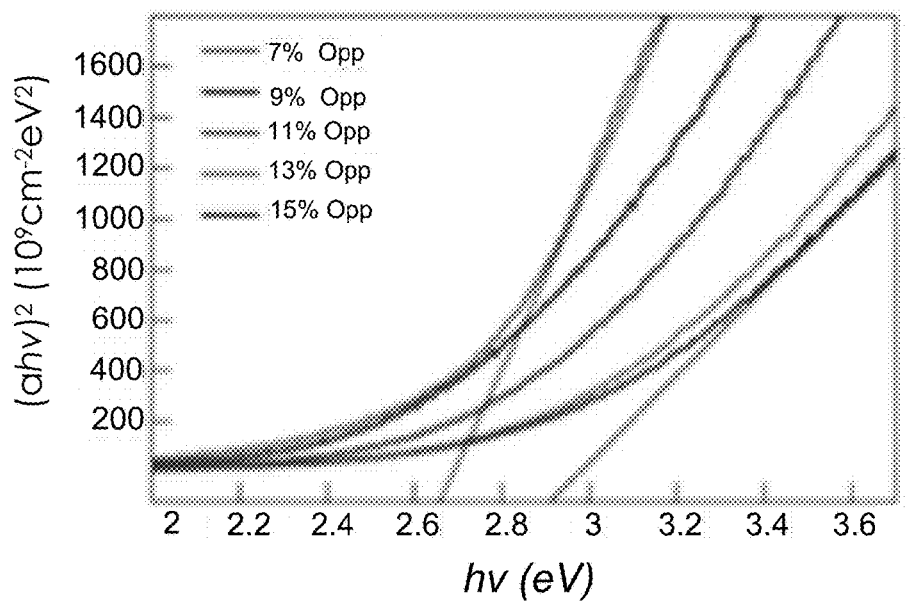
FIG. 13C is a tauc plot of optical band gap extraction.

FIG. 13A is a graph illustrating a comparison of reported field-effect mobility versus maximum processing temperature (either deposition or post annealing) for leading p-type oxides. The reference is indicated in square brackets. Mobility of a-IGZO (n-type) and a-Si:H are not plotted as a function of the temperature and are used just for comparison. FIG. 13B is a graph illustrating a transmission spectra of the components of the TFT. FIG. 13C is a graph representing a tauc plot of the optical band gap extraction (indicated by the dotted line) of the films deposited at 1.8 mTorr.

The transmittance spectra of the gate electrode and the gate dielectric, the mp-SnO layer, and the final stack are shown in FIG. 13B. The average optical transmission of the 15 nm mp-SnO layer in the visible region (400-700 nm) is 92%, while it is 63% for the entire device, mainly limited by the Ti layer. The use of the Ti source and drain contact interlayer results from the observation of enhanced device performance over some other contacts like Au, Ni, Pt, and ITO. The optical bandgap, $E_G$, has been estimated from the absorption coefficient, a, calculated as a function of the incident photon energy, hv. $E_G$ was obtained by extrapolating the linear portion in the $(\alpha hv)^2$ vs hv plot, as shown in FIG. 13C by the dotted lines. The estimated $E_G$ ranges from 2.65 eV for 7% $O_{PP}$ to 2.92 eV for 15% $O_{PP}$, matching well with that of pure SnO.

Conclusions

We have demonstrated the highest hole mobility reported to date for a p-type oxide processed at low temperature by careful process control. A detailed phase map for nanoscale physical vapor deposition of tin monoxide has been developed for the first time. We have shown that control of the phase formation of tin monoxide films greatly enhances the carrier mobility yielding $\mu_{Hall}$=18.7 cm$^2$ V$^{-1}$ s$^{-1}$. Residual second phases must be carefully optimized to obtain maximum hole mobility. Furthermore, we have demonstrated record device performance for a transparent p-type oxide semiconductor on both rigid and flexible substrates, with a linear-region field-effect mobility of 6.75 cm$^2$ V$^{-1}$ s$^{-1}$ and 5.87 cm$^2$ V$^{-1}$ s$^{-1}$, respectively, a threshold voltage of −1 V and an $I_{ON}/I_{OFF}$ ratio of 6×10$^3$.

Experiment

Film Fabrication and Characterization.

Pure SnO and mixed phase (mp-SnO) films were deposited onto soda-lime glass substrates by direct current (DC) reactive magnetron sputtering using a 2 in. (5.08 cm) tin metal target from Angstrom Science, Canada, with a purity of 99.99%. The reactive sputtering was performed at room temperature in a mixture of argon and oxygen gases, in an AMOD-model thin film deposition tool designed by Angstrom Engineering. To determine optimal deposition conditions, the oxygen partial pressure was varied from 3% to 50%. The deposition pressure was scanned from 1 to 4 mTorr while the DC power was held at 30 W (9.55 W/in$^2$ power density). The distance between the target and the substrate was 20 cm, while the gun is located at 160° with respect to the horizon, achieving a deposition rate of 0.8 Å/s. Post-annealing in air was performed in a tube furnace at 180° C. for 30 min.

TFT Fabrication and Characterization.

The bottom gate indium tin oxide (ITO) layers were deposited by radio frequency magnetron sputtering at room temperature. The HfO$_2$ (220 nm) gate dielectric was deposited on top of 150 nm ITO-coated glass/polyimide substrates by atomic layer deposition. The active layer consisted of 15 nm of SnO deposited at different oxygen partial pressures. The stack was completed with 8 nm electron-beam evaporated Ti and 90 nm sputtered ITO source and drain contacts followed by thermal treatment at 180° C. in air, for 30 min, to crystallize both the SnO and ITO layers. The devices were patterned by photolithography and lift-off technique and measured on a probe station in air using a Keithley 4200-SCS semiconductor parameter analyzer at room temperature in the dark. The performance of the TFTs was evaluated on devices with a width-to-length ratio (W/L) of 1 having W and L of 50 µm, respectively. Linear-region field-effect mobility ($\mu_{FE}$), threshold voltage ($V_T$) and subthreshold swing (S) were evaluated with the conventional metal-oxide-semiconductor field effect transistor model described in eqs 1 and 2:

$$\beta s = \mu C_{ox} \frac{W}{L}\left[(V_{GS} - V_T)V_{DS} - \frac{V_{DS}^2}{2}\right] \text{ for } V_{DS} < \quad (2)$$

$$V_{GS} - V_T$$

where $C_{ox}$ is the capacitance per unit area of the gate insulator and measured to be 60 nFcm$^{-2}$ with no more than 3% variation in the frequency range from 1 kHz to 1 MHz and an extracted dielectric constant of ≈14.

$$S = \frac{dV_{GS}}{d(\log I_{DS})} \approx \ln 10 \frac{kT}{q}\left[1 + \frac{qC_d}{C_{ox}}\right]$$

References for Example 1

1. Sun, Y.; Rogers, J. A. Inorganic Semiconductors for Flexible Electronics. Adv. Mater. 2007, 19, 1897-1916.
2. Nomura, K.; Ohta, H.; Takagi, A.; Kamiya, T.; Hirano, M.; Hosono, H. Room-Temperature Fabrication of Transparent Flexible Thin-Film Transistors Using Amorphous Oxide Semiconductors. Nature 2004, 432, 484-492.
3. Kykyneshi, R.; Zeng, G.; Cann, D. P., Transparent Conducting Oxides Based on Tin Oxide. In Handbook of Transparent Conductors; Ginley, D. S., Hosono, H., Paine, D. C., Eds.; Springer: New York, 2010; pp 171-191.
4. Kim, B.; Hyung Nyuck, C.; Woo Seok, C.; Seung-Hee, K.; Yong, Ho, J.; Juhn-Suk, Y.; Soo Young, Y.; Myungchul, J.; Yong-Kee, H.; Min-Koo, H. Highly Reliable Depletion-Mode a-IGZO TFT Gate Driver Circuits for High-Frequency Display Applications Under Light Illumination. IEEE Electron Device Lett. 2012, 33, 528-530.
5. Kim, K. M.; Kim, C. W.; Heo, J.-S.; Na, H.; Lee, J. E.; Park, C. B.; Bae, J.-U.; Kim, C.-D.; Jun, M.; Hwang, Y. K.; et al. Competitive Device Performance of Low-Temperature and All-Solution-Processed Metal-Oxide Thin-Film Transistors. Appl. Phys. Lett. 2011, 99, 242109-1-242109-3.
6. Fortunato, E.; Barquinha, P.; Martins, R. Oxide Semiconductor Thin-Film Transistors: A Review of Recent Advances. Adv. Mater. 2012, 24, 2945-2986.
7. Reuss, R. H.; Chalamala, B. R.; Moussessian, A.; Kane, M. G.; Kumar, A.; Zhang, D. C.; Rogers, J. A.; Hatalis, M.; Temple, D.; Moddel, G.; et al. Macroelectronics: Perspectives on Technology and Applications. Proc. IEEE 2005, 93, 1239-1256.
8. Kim, M.-G.; Kanatzidis, M. G.; Facchetti, A.; Marks, T. J. Low-Temperature Fabrication of High-Performance Metal Oxide Thin-Film Electronics via Combustion Processing. Nat. Mater. 2011, 10, 382-388.
9. Arias, A. C.; MacKenzie, D. J.; McCulloch, I.; Rivnay, J.; Salleo, A. Materials and Applications for Large Area Electronics: Solution-Based Approaches. Chem. Rev. 2010, 110, 3-24.
10. Fortunato, E. M. C.; Barquinha, P. M. C.; Pimentel, A. C. M. B. G.; Goncalves, A. M. F.; Marques, A. J. S.; Pereira, L. M. N.; Martins, R. F. P. Fully Transparent ZnO Thin-Film Transistor Produced at Room Temperature. Adv. Mater. 2005, 17, 590-594.
11. Kim, H. S.; Byrne, P. D.; Facchetti, A.; Marks, T. J. High Performance Solution-Processed Indium Oxide Thin-Film Transistors. J. Am. Chem. Soc. 2008, 130, 12580-12581.
12. Nayak, P. K.; Hedhili, M. N.; Cha, D. K.; Alshareef, H. N. High Performance Solution-Deposited Amorphous Indium Gallium Zinc Oxide Thin Film Transistors by Oxygen Plasma Treatment. Appl. Phys. Lett. 2012, 100, 202106-1-202106-4.
13. Sung, S.-Y.; Kim, S.-Y.; Jo, K.-M.; Lee, J.-H.; Kim, J.-J.; Kim, S.-G.; Chai, K.-H.; Pearton, S. J.; Norton, D. P.; Heo, Y.-W. Fabrication of p-Channel Thin-Film Transistors Using CuO Active Layers Deposited at Low Temperature. Appl. Phys. Lett. 2010, 97, 222109-1-222109-3.
14. Yao, Z. Q.; Liu, S. L.; Zhang, L.; He, B.; Kumar, A.; Jiang, X.; Zhang, W. J.; Shao, G. Room Temperature Fabrication of p-Channel Cu2O Thin-Film Transistors on Flexible Polyethylene Terephthalate Substrates. Appl. Phys. Lett. 2012, 101, 042114-1-042114-4.
15. Zou, X.; Guojia, F.; Longyan, Y.; Meiya, L.; Wenjie, G.; Xingzhong, Z. Top-Gate Low-Threshold Voltage p-Cu2O Thin-Film Transistor Grown on SiO2/Si Substrate Using a High-k HfON Gate Dielectric. IEEE Electron Device Lett. 2010, 31, 827-829.
16. Matsuzaki, K.; Nomura, K.; Yanagi, H.; Kamiya, T.; Hirano, M.; Hosono, H. Epitaxial Growth of High Mobility Cu2O Thin Films and Application to p-Channel Thin Film Transistor. Appl. Phys. Lett. 2008, 93, 202107-1-202107-3.
17. Fortunato, E.; Figueiredo, V.; Barquinha, P.; Elamurugu, E.; Barros, R.; Goncalves, G.; Park, S.-H. K.; Hwang, C.-S.; Martins, R. Thin-Film Transistors Based on p-type Cu2O Thin Films Produced at Room Temperature. Appl. Phys. Lett. 2010, 96, 192102-1-192102-3.
18. Fortunato, E.; Barros, R.; Barquinha, P.; Figueiredo, V.; Park, S.-H. K.; Hwang, C.-S.; Martins, R. Transparent p-type SnOx Thin Film Transistors Produced by Reactive rf Magnetron Sputtering Followed by Low Temperature Annealing. Appl. Phys. Lett. 2010, 97, 052105-1-052105-3.
19. Guo, W.; Fu, L.; Zhang, Y.; Zhang, K.; Liang, L. Y.; Liu, Z. M.; Cao, H. T.; Pan, X. Q. Microstructure, Optical, and Electrical Properties of p-type SnO Thin Films. Appl. Phys. Lett. 2010, 96, 042113-1-042113-3.
20. Lee, H.-N.; Kim, H.-J.; Kim, C.-K. p-Channel Tin Monoxide Thin Film Transistor Fabricated by Vacuum Thermal Evaporation. Jpn. J. Appl. Phys. 2010, 49, 020202-1-020202-3.
21. Liang, L. Y.; Liu, Z. M.; Cao, H. T.; Xu, W. Y.; Sun, X. L.; Luo, H.; Gang, K. The Structural, Optical and Electrical Properties of Y-doped SnO Thin Films and Their p-Type TFT Application. J. Phys. D: Appl. Phys. 2012, 45, 085101-1-085101-5.
22. Ogo, Y.; Hiramatsu, H.; Nomura, K.; Yanagi, H.; Kamiya, T.; Hirano, M.; Hosono, H. p-Channel Thin-Film Transistor Using p-Type Oxide Semiconductor, SnO. Appl. Phys. Lett. 2008, 93, 032113-1-032113-3.
23. Yabuta, H.; Kaji, N.; Hayashi, R.; Kumomi, H.; Nomura, K.; Kamiya, T.; Hirano, M.; Hosono, H. Sputtering Formation of p-Type SnO Thin-Film Transistors on Glass Toward Oxide Complimentary Circuits. Appl. Phys. Lett. 2010, 97, 072111-1-072111-3.
24. Batzill, M.; Diebold, U. The Surface and Materials Science of Tin Oxide. Prog. Surf. Sci. 2005, 79, 47-154.
25. Pan, X. Q.; Fu, L. Oxidation and Phase Transitions of Epitaxial Tin Oxide Thin Films on (1-bar 012) Sapphire. J. Appl. Phys. 2001, 89, 6048-6055.
26. Geurts, J.; Rau, S.; Richter, W.; Schmitte, F. J. SnO Films and Their Oxidation to SnO2: Raman Scattering, IR Reflectivity, and X-ray Diffraction Studies. Thin Solid Films 1984, 121, 217-225.
27. Birkholz, M. Thin-Film Analysis by X-ray Scattering; Wiley-VCH: Weinheim, Germany, 2006.
28. Ramadan, A. A.; Abd El-Mongy, A. A.; EI-Shabiny, A. M.; Mater, A. T.; Mostafa, S. H.; EI-Sheheedy, E. A.; Hashem, H. M. Addressing Difficulties in Using XRD Intensity for Structural Study of Thin Films. Crys. Res. Technol. 2009, 44, 111-116.
29. Delhez, R.; Keijser, T. H.; Mittemeijer, E. J. Determination of Crystallite Size and Lattice Distortions through X-ray Diffraction Line Profile Analysis. Fresenius Z. Anal. Chem. 1982, 312, 1-16.
30. Togo, A.; Oba, F.; Tanaka, I.; Tatsumi, K. First-Principles Calculations of Native Defects in Tin Monoxide. Phys. Rev. B 2006, 74, 195128-1-195128-8.
31. Watson, G. W. The Origin of The Electron Distribution in SnO. J. Chem. Phys. 2001, 114, 758-763.
32. Ogo, Y.; Hiramatsu, H.; Nomura, K.; Yanagi, H.; Kamiya, T.; Kimura, M.; Hirano, M.; Hosono, H. Tin Monoxide as an s-Orbital-Based p-type Oxide Semiconductor: Electronic Structures and TFT Application. Phys. Status Solidi A 2009, 206, 2187-2191.
33. Wager, J. F. Transfer-Curve Assessment of Oxide Thin-Film Transistors. J. Soc. Inf. Disp. 2010, 18, 749-752.
34. Lee, C.-G.; Dodabalapur, A. Solution-Processed Zinc-Tin Oxide Thin-Film Transistors with Low Interfacial Trap Density and Improved Performance. Appl. Phys. Lett. 2010, 96, 243501-1-243501-3.

It should be noted that ratios, concentrations, amounts, and other numerical data may be expressed herein in a range format. It is to be understood that such a range format is used for convenience and brevity, and thus, should be interpreted in a flexible manner to include not only the numerical values explicitly recited as the limits of the range, but also to include all the individual numerical values or sub-ranges encompassed within that range as if each numerical value and sub-range is explicitly recited. To illustrate, a concentration range of "about 0.1% to about 5%" should be interpreted to include not only the explicitly recited concentration of about 0.1 wt % to about 5 wt %, but also include individual concentrations (e.g., 1%, 2%, 3%, and 4%) and the sub-ranges (e.g., 0.5%, 1.1%, 2.2%, 3.3%, and 4.4%) within the indicated range. In an embodiment, the term "about" can include traditional rounding according to figures and the measurement techniques. In addition, the phrase "about 'x' to 'y'" includes "about 'x' to about 'y'". When a range includes "zero" and is modified by "about" (e.g., about one to zero or about zero to one), about zero can include, 0, 0.1, 0.01, or 0.001.

While only a few embodiments of the present disclosure have been shown and described herein, it will become apparent to those skilled in the art that various modifications and changes can be made in the present disclosure without departing from the spirit and scope of the present disclosure. All such modification and changes coming within the scope of the appended claims are intended to be carried out thereby.

Therefore, the following is claimed:

1. A field effect transistor for temperature history detection comprising:
   a substrate;
   a gate electrode positioned on the substrate and made of a material with conductive properties;
   a gate dielectric positioned over the gate electrode, wherein the gate dielectric is an insulator;
   a gate channel that includes a nanowire formed over the gate dielectric;
   a source electrode connected at one end of the nanowire; and
   a drain electrode connected at another end of the nanowire,
   wherein the nanowire is configured to convert from p-type conduction to n-type conduction at a transition temperature associated with a volume of the nanowire.

2. The system of claim 1, wherein the transition temperature of the nanowire is adjusted by selecting a volume of the nanowire.

3. The system of claim 1, wherein a width of the nanowire is between 10 nanometers and 500 nanometers.

4. The system of claim 1, wherein a length of the nanowire is between 1 micrometer to 10 micrometers.

5. The system of claim 1, wherein a thickness of the nanowire is between 5 nanometers and 50 nanometers.

6. The system of claim 1, wherein the nanowire is a tin monoxide nanowire.

7. The system of claim 6, wherein the tin monoxide is a metastable form of tin oxide.

8. A method comprising:
   testing a polarity of a field effect transistor comprising a nanowire as a gate channel;
   determining a transition temperature of the nanowire, which is associated with a temperature when the nanowire transitions from a p-type conduction to a n-type conduction, wherein the transition temperature depends on a volume of the nanowire; and
   determining whether the nanowire has been exposed to the transition temperature,
   wherein the field effect transistor has a gate dielectric formed between the nanowire and a gate electrode, and the nanowire is connected to a source electrode and a drain electrode.

9. The method of claim 8, wherein the transition temperature is between 100° C. and 200° C.

10. The method of claim 8, wherein a width of the nanowire is between 10 nanometers and 500 nanometers, a length of the nanowire is between 1 micrometer and 10 micrometers, and a thickness of the nanowire is between 5 nanometers and 50 nanometers.

11. The method of claim 8, wherein the nanowire is a tin monoxide nanowire.

12. The method of claim 11, wherein the nanowire converts from the tin monoxide to a tin dioxide at the transition temperature.

13. A matrix of field effect transistors, each field effect transistor comprising:
- a substrate;
- a gate electrode positioned in proximity to the substrate;
- a gate dielectric displaced on the gate electrode;
- a source electrode formed on the substrate;
- a drain electrode formed on the substrate; and
- a nanowire formed on the gate dielectric, wherein one end of the nanowire is coupled to the source electrode and another end of the nanowire is coupled to the drain electrode,
- wherein a first nanowire of a first field effect transistor has a first volume and a second nanowire of a second field effect transistor has a second volume,
- wherein the first volume is different from the second volume, and
- wherein the first volume and the second volume are associated with a corresponding transition temperature that is indicative of a temperature for which the nanowire transitions from p-type conduction to n-type conduction.

14. The matrix of field effect transistors of claim 13, wherein the first volume has a width of about 10 nanometers to 500 nanometers.

15. The matrix of field effect transistors of claim 13, wherein the first volume has a length of about 1 micrometer to 10 micrometers.

16. The matrix of field effect transistors of claim 13, wherein the first volume has a thickness of about 5 nanometers to 50 nanometers.

17. The matrix of field effect transistors of claim 13, wherein a maximum exposure temperature is determined based on the transition temperature.

18. The matrix of field effect transistors of claim 13, wherein the gate electrode is made of a material with conductive properties.

19. The matrix of field effect transistors of claim 13, wherein the first and second nanowires each comprises a thin film of tin monoxide at least partially in contact with the source electrode at one end and the drain electrode at the other end, the thin film of tin monoxide operating as a semiconducting channel between the source electrode and the drain electrode.

20. The matrix of field effect transistors of claim 19, wherein the tin monoxide converts to tin dioxide at the transition temperature.

* * * * *